(12) United States Patent
Kinoshita et al.

(10) Patent No.: US 7,803,512 B2
(45) Date of Patent: Sep. 28, 2010

(54) POSITIVE RESIST COMPOSITION AND METHOD OF FORMING RESIST PATTERN

(75) Inventors: Yohei Kinoshita, Kawasaki (JP); Isao Hirano, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 481 days.

(21) Appl. No.: 11/816,272

(22) PCT Filed: Dec. 13, 2005

(86) PCT No.: PCT/JP2005/022878

§ 371 (c)(1),
(2), (4) Date: Aug. 14, 2007

(87) PCT Pub. No.: WO2006/087865

PCT Pub. Date: Aug. 24, 2006

(65) Prior Publication Data

US 2009/0068588 A1      Mar. 12, 2009

(30) Foreign Application Priority Data

Feb. 16, 2005   (JP)  .............................. 2005-038944

(51) Int. Cl.
G03F 7/004       (2006.01)
G03F 7/30        (2006.01)

(52) U.S. Cl. .................... 430/270.1; 430/326; 430/910; 430/921; 430/922

(58) Field of Classification Search ............... 430/270.1, 430/326, 910, 921, 922
See application file for complete search history.

(56) References Cited

U.S. PATENT DOCUMENTS

| | | | |
|---|---|---|---|
| 2002/0177068 A1* | 11/2002 | Park et al. | 430/270.1 |
| 2003/0232273 A1 | 12/2003 | Adams et al. | |
| 2008/0193871 A1* | 8/2008 | Ogata et al. | 430/270.1 |
| 2009/0035698 A1* | 2/2009 | Kinoshita et al. | 430/285.1 |
| 2009/0098483 A1* | 4/2009 | Kinoshita et al. | 430/285.1 |

FOREIGN PATENT DOCUMENTS

| | | |
|---|---|---|
| JP | 2881969 | 4/1999 |
| JP | 2000181054 | 6/2000 |
| JP | 2003212823 | 7/2003 |
| JP | 2003-295444 | 10/2003 |
| JP | 2005-234449 | 9/2005 |
| JP | 2006-1907 | 1/2006 |
| WO | WO 2005075446 | 8/2005 |
| WO | WO 2005123795 | 12/2005 |

OTHER PUBLICATIONS

Office Action issued on Jun. 10, 2008, on the counterpart Japanese Patent Application No. 2005-38944.

Ogata, Toshiyuki, "Effects of Protecting Group on Resist Characteristics of Acryl Polymers for 193nm Lithography", Journal of Photopolymer Science and Technology, vol. 17, No. 4, 2004, p. 483-488.

International Search Report from PCT/JP2005/022878, mailed on Mar. 20, 2006.

* cited by examiner

Primary Examiner—John S Chu
(74) Attorney, Agent, or Firm—Knobbe, Martens, Olson & Bear, LLP

(57) ABSTRACT

A positive resist composition that includes a resin component (A) that exhibits increased alkali solubility under the action of acid, and an acid generator component (B) that generates acid on exposure to radiation, wherein the component (A) includes a structural unit (a1) represented by a general formula (a1-2) or (a1-4), a structural unit (a2) derived from an acrylate ester that contains a lactone-containing monocyclic or polycyclic group, and a structural unit (a3), which is different from the structural unit (a1) and the structural unit (a2), and is derived from an acrylate ester that contains an aliphatic cyclic group-containing non-acid-dissociable, dissolution-inhibiting group and contains no polar groups, and the component (B) includes an onium salt (B1) having an anion portion represented by a formula: $R^{41}$—$SO_3^-$.

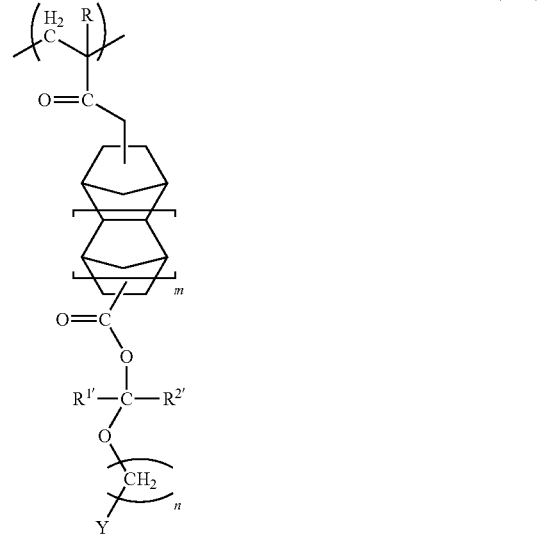

8 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2005/022878, filed Dec. 13, 2005, which designated the United States and was published in a language other than English, which claims priority under 35 U.S.C. §119(a)-(d) to Japanese Patent Application No. 2005-038944, filed Feb. 16, 2005. The content of these applications is incorporated herein by reference in their entireties.

TECHNICAL FIELD

The present invention relates to a positive resist composition and a method of forming a resist pattern.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultra violet radiation typified by g-line and i-line radiation has been used, but nowadays, KrF excimer lasers (248 nm) are the main light source used in mass production, and ArF excimer lasers (193 nm) are now also starting to be introduced in mass production. Furthermore, research is also being conducted into lithography techniques that use $F_2$ excimer lasers (157 nm), EUV (extreme ultra violet radiation), and EB (electron beams) and the like as the light source (radiation source).

Resists for use with these types of short wavelength light sources require a high resolution capable of reproducing patterns of minute dimensions, and a high level of sensitivity relative to these types of short wavelength light sources. One example of a known resist that satisfies these conditions is a chemically amplified resist, which includes a base resin and an acid generator (hereafter referred to as a PAG) that generates acid on exposure, and these chemically amplified resists include positive resists in which the alkali solubility of the exposed portions increases, and negative resists in which the alkali solubility of the exposed portions decreases.

Until recently, polyhydroxystyrene (PHS) or PHS-based resins in which the hydroxyl groups have been protected with acid-dissociable, dissolution-inhibiting groups, which exhibit a high degree of transparency relative to a KrF excimer laser (248 nm), have been used as the base resin of chemically amplified resists. However because PHS-based resins contain aromatic rings such as benzene rings, their transparency relative to light with wavelengths than shorter than 248 nm, such as light of 193 nm, is inadequate. Accordingly, chemically amplified resists that use a PHS-based resin as the base resin component suffer from low levels of resolution in processes that use light of 193 nm.

As a result, resins that contain structural units derived from (meth)acrylate esters within the principal chain (acrylic resins) are now widely used as the base resins for resists that use ArF excimer laser lithography, as they offer excellent transparency in the vicinity of 193 nm. Furthermore in the case of positive resists, as disclosed in the patent reference 1 listed below, resins that contain structural units derived from tertiary ester compounds of (meth)acrylic acid such as 2-alkyl-2-adamantyl (meth)acrylates as the structural units containing an acid-dissociable, dissolution-inhibiting group are now widely used. These resins are known to exhibit a high dissociation energy for the acid-dissociable, dissolution-inhibiting groups, meaning there are restrictions on the types of acid generators that can be used within resist compositions that use these resins. In other words, unless an acid generator that generates a strong acid is used, such as an onium salt containing a fluorinated alkylsulfonate ion as the anion, the acid-dissociable, dissolution-inhibiting groups do not dissociate satisfactorily, and the composition is unable to function satisfactorily as a resist.

In recent years, resins containing structural units in which the hydrogen atom of (meth)acrylic acid has been substituted with a so-called acetal group such as a 1-alkoxyalkyl group have been attracting considerable attention as resins containing acid-dissociable, dissolution-inhibiting groups for use within ArF excimer laser lithography and the like (see non-patent reference 1).

[Patent Reference 1]
Japanese Patent (Granted) Publication No. 2,881,969
[Non-Patent Reference 1]
J. Photopolym. Sci. Technol. 17 (2004), 483 to 488

DISCLOSURE OF INVENTION

Resins that contain acetal groups as the acid-dissociable, dissolution-inhibiting groups have a lower dissociation energy for the acid-dissociable, dissolution-inhibiting groups than resins containing structural units derived from tertiary ester compounds, and this is believed to contribute to a higher sensitivity for the resist.

However, when a resist pattern is formed with a positive resist composition that uses a resin containing acetal groups as the acid-dissociable, dissolution-inhibiting groups, roughness develops in the side wall surfaces of the resist pattern, namely line edge roughness (LER), and the shape of the resist pattern TOP tends to become rounded, indicating unsatisfactory shape (unsatisfactory rectangular formability). LER (line edge roughness) can cause distortions around the holes in hole patterns, and fluctuations in the line width in line and space patterns, and consequently has the potential to adversely affect the formation of very fine semiconductor elements.

The present invention addresses the circumstances described above, with an object of providing a positive resist composition and a method of forming a resist pattern that can form a resist pattern with reduced LER and excellent shape.

As a result of intensive investigation, the inventors of the present invention discovered that the above object could be achieved by combining a resin containing three specific structural units and an onium salt having a specific anion portion, and they were therefore able to complete the present invention.

In other words, a first aspect of the present invention provides a positive resist composition that includes a resin component (A) that exhibits increased alkali solubility under the action of acid, and an acid generator component (B) that generates acid on exposure to radiation, wherein the resin component (A) includes one or more structural units (a1) selected from the group consisting of structural units represented by general formulas (a1-2) and (a1-4) shown below:

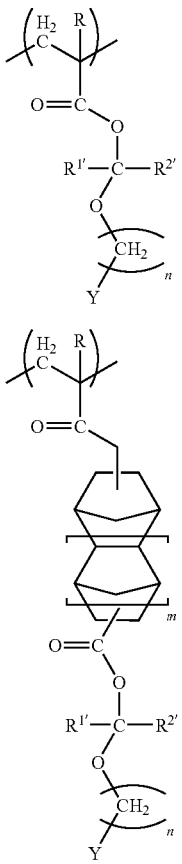

[wherein, Y represents a lower alkyl group or an aliphatic cyclic group; n represents either 0 or an integer from 1 to 3; m represents either 0 or 1; R represents a hydrogen atom, fluorine atom, lower alkyl group, or fluorinated lower alkyl group; and $R^{1'}$ and $R^{2'}$ each represent, independently, a hydrogen atom or a lower alkyl group], a structural unit (a2) derived from an acrylate ester that contains a lactone-containing monocyclic or polycyclic group, and a structural unit (a3), which is different from the structural unit (a1) and the structural unit (a2), and is derived from an acrylate ester that contains an aliphatic cyclic group-containing, non-acid-dissociable, dissolution-inhibiting group and contains no polar groups, and the acid generator component (B) includes an onium salt (B1) having an anion portion represented by a general formula (B-01) shown below:

$$R^{41}-SO_3^- \qquad (B\text{-}01)$$

[wherein, $R^{41}$ represents an alkyl group or fluoroalkyl group that contains a cyclic group of 4 to 12 carbon atoms].

A second aspect of the present invention is a method of forming a resist pattern that includes the steps of: forming a resist film on a substrate using the positive resist composition of the first aspect described above, conducting exposure of the resist film, and developing the resist film to form a resist pattern.

In the present invention, a "structural unit" refers to a monomer unit that contributes to the formation of a polymer (resin).

A "structural unit derived from an acrylate ester" refers to a structural unit formed by cleavage of the ethylenic double bond of an acrylate ester. The term "acrylate ester" is a general concept that includes not only the acrylate ester in which a hydrogen atom is bonded to the α-position carbon atom, but also structures in which a substituent group (an atom or group other than a hydrogen atom) is bonded to the α-position. Examples of suitable substituent groups include a halogen atom such as a fluorine atom, an alkyl group or a haloalkyl group. These alkyl groups or haloalkyl groups preferably contain from 1 to 5 carbon atoms. In a "structural unit derived from an acrylate ester", unless stated otherwise, the term "α-position" or "α-position carbon atom" refers to the carbon atom to which the carbonyl group is bonded.

Unless stated otherwise, the term "alkyl group" includes straight-chain, branched-chain and cyclic monovalent saturated hydrocarbon groups.

The term "exposure" is a general concept that includes irradiation with any form of radiation.

According to a positive resist composition and a method of forming a resist pattern of the present invention, a resist pattern with reduced LER and excellent shape can be formed.

BEST MODE FOR CARRYING OUT THE INVENTION

Positive Resist Composition

The positive resist composition of the present invention includes a resin component (A) that exhibits increased alkali solubility under the action of acid (hereafter referred to as the component (A)), and an acid generator component (B) that generates acid on exposure to radiation (hereafter referred to as the component (B)).

In the positive resist composition of the present invention, because the component (A) includes a structural unit (a1) that contains a so-called acid-dissociable, dissolution-inhibiting group, the component (A) is insoluble in alkali prior to exposure, but the action of the acid generated from the component (B) upon exposure causes the acid-dissociable, dissolution-inhibiting groups to dissociate, thereby increasing the alkali solubility of the entire component (A), and causing the resin component to change from an alkali-insoluble state to an alkali-soluble state. As a result, when the resist film obtained using the positive resist composition is selectively exposed during the formation of a resist pattern, or alternatively, is exposed and then subjected to post exposure baking (PEB), the exposed portions of the resist shift to an alkali-soluble state, whereas the unexposed portions remain insoluble in alkali, meaning that alkali developing can then be used to form a positive resist pattern.

<Component (A)>

In the present invention, the component (A) must include a structural unit (a1), a structural unit (a2), and a structural unit (a3) described below.

Structural Unit (a1)

The structural unit (a1) includes one or more structural units selected from the group consisting of structural units represented by the general formulas (a1-2) and (a1-4) shown above.

The structural unit (a1) is a structural unit in which an acetal group (alkoxyalkyl group) type acid-dissociable, dissolution-inhibiting group represented by a formula —C($R^{1'}$)($R^{2'}$)—O(CH$_2$)$_n$—Y is bonded to the oxygen atom at the terminal of a carbonyloxy group (—C(O)—O—) derived from a carboxyl group. Because the dissociation (deprotection) energy for this acid-dissociable, dissolution-inhibiting group is lower than that of conventionally used tertiary alkyl groups such as the widely used 2-alkyl-2-adamantyl groups, the acid-dissociable, dissolution-inhibiting group can be satisfactorily dissociated using the acid generated from the onium salt (B1) described below, meaning very fine patterns can be resolved.

In the formulas (a1-2) and (a1-4), R represents a hydrogen atom, fluorine atom, lower alkyl group, or fluorinated lower alkyl group.

Lower alkyl groups represented by R are preferably alkyl groups of 1 to 5 carbon atoms, and are preferably straight-chain or branched-chain alkyl groups, and specific examples include a methyl group, ethyl group, propyl group, isopropyl group, n-butyl group, isobutyl group, tert-butyl group, pentyl group, isopentyl group, and neopentyl group. From an industrial viewpoint, R is preferably a methyl group.

A fluorinated lower alkyl group is a group in which either a portion of, or all of, the hydrogen atoms of an above lower alkyl group of 1 to 5 carbon atoms have been substituted with fluorine atoms. In the present invention, groups in which all of the hydrogen atoms have been fluorinated are preferred. The fluorinated lower alkyl group is preferably a straight-chain or branched-chain fluorinated lower alkyl group, a trifluoromethyl group, hexafluoroethyl group, heptafluoropropyl group, or nonafluorobutyl group is even more preferred, and a trifluoromethyl group ($-CF_3$) is the most desirable.

The R group is preferably a hydrogen atom, trifluoromethyl group, or methyl group, and a methyl group is the most desirable.

$R^{1'}$ and $R^{2'}$ each represent, independently, a hydrogen atom or a lower alkyl group. Examples of suitable lower alkyl groups for $R^{1'}$ and $R^{2'}$ include the same lower alkyl groups as those exemplified above in relation to the group R. In the present invention, from the viewpoint of suppressing pattern collapse, at least one of $R^{1'}$ and $R^{2'}$ is preferably a hydrogen atom, and those cases in which both $R^{1'}$ and $R^{2'}$ are hydrogen atoms are even more desirable.

n represents either 0 or an integer from 1 to 3, preferably either 0 or an integer from 1 to 2, even more preferably either 0 or 1, and is most preferably 1.

Y represents a lower alkyl group or an aliphatic cyclic group.

Examples of suitable lower alkyl groups for Y include the same lower alkyl groups as those exemplified above in relation to the group R.

An aliphatic cyclic group represented by Y can be selected from the multitude of monocyclic and polycyclic aliphatic cyclic groups proposed for use within conventional ArF resists and the like.

In this description and in the claims, the term "aliphatic" is a relative concept used in relation to the term "aromatic", and defines a group or compound or the like that contains no aromaticity. The term "aliphatic cyclic group" describes a monocyclic group or polycyclic group that contains no aromaticity.

The aliphatic cyclic group may contain a substituent group, or may contain no substituent groups. Examples of suitable substituent groups include lower alkyl groups of 1 to 5 carbon atoms, a fluorine atom, fluorinated lower alkyl groups of 1 to 5 carbon atoms that have been substituted with fluorine atoms, and an oxygen atom (=O).

In the aliphatic cyclic group, the basic ring structure not including the substituent groups may be either a hydrocarbon group formed solely from carbon and hydrogen (an alicyclic group), or a heterocyclic group in which a portion of the carbon atoms that constitute the ring structure of the alicyclic group have been substituted with a hetero atom (such as an oxygen atom or nitrogen atom), although an alicyclic group is preferred.

The aliphatic cyclic group may be either saturated or unsaturated, but is preferably saturated.

Specific examples of the aliphatic cyclic group include monocyclic groups of 5 to 7 carbon atoms, and polycyclic groups of 10 to 16 carbon atoms. Examples of aliphatic monocyclic groups of 5 to 7 carbon atoms include groups in which one hydrogen atom has been removed from a monocycloalkane, and specific examples include groups in which one hydrogen atom has been removed from cyclopentane or cyclohexane. Examples of aliphatic polycyclic groups of 10 to 16 carbon atoms include groups in which one hydrogen atom has been removed from a bicycloalkane, tricycloalkane or tetracycloalkane or the like, and specific examples include groups in which one hydrogen atom has been removed from a polycycloalkane such as adamantane, norbornane, isobornane, tricyclodecane or tetracyclododecane. Of these, aliphatic polycyclic groups are preferred, and from an industrial viewpoint, an adamantyl group, norbornyl group or tetracyclododecanyl group is preferred, and an adamantyl group is particularly desirable.

Specific examples of the acid-dissociable, dissolution-inhibiting group represented by the general formula $-C(R^{1'})(R^{2'})-O(CH_2)_n-Y$ within the formulas (a1-2) and (a1-4) include groups with structures represented by the chemical formulas shown below.

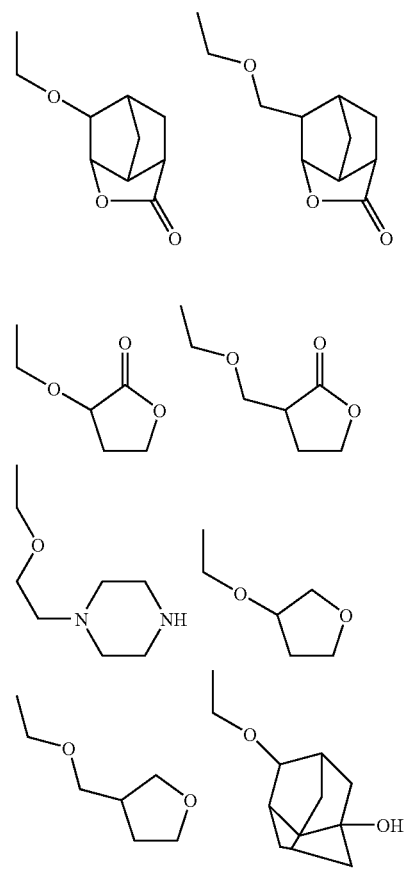

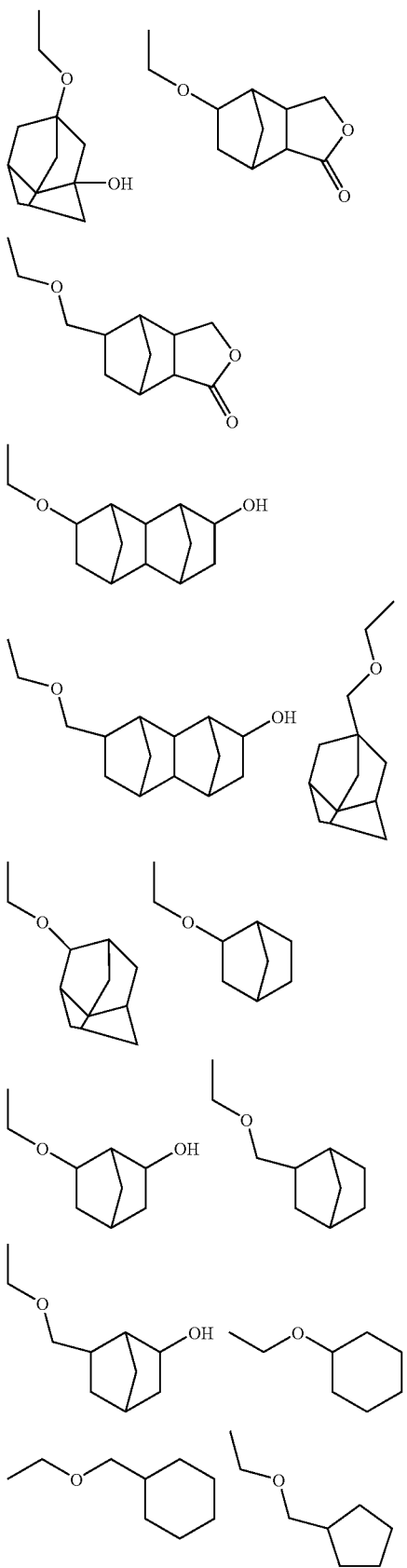
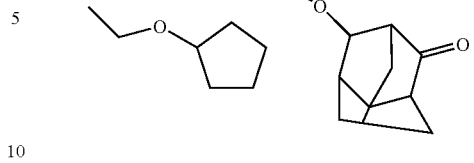
Specific examples of the structural units represented by the above general formulas (a1-2) and (a1-4) are shown below.
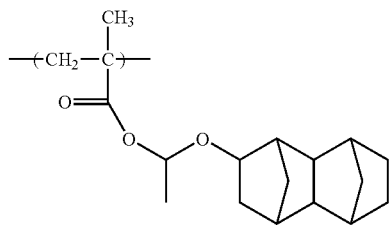
(a1-2-1)
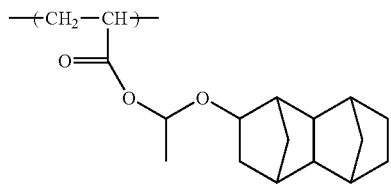
(a1-2-2)
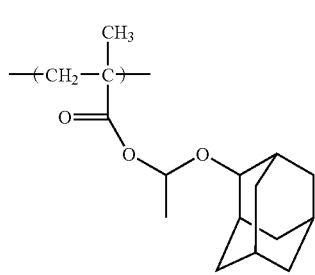
(a1-2-3)
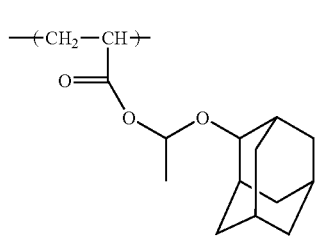
(a1-2-4)
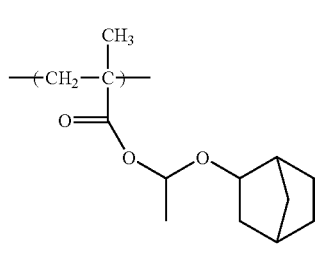
(a1-2-5)

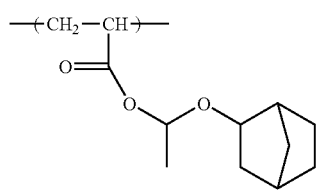
(a1-2-6)
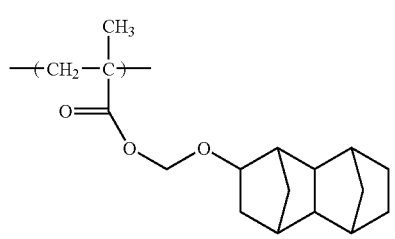
(a1-2-7)
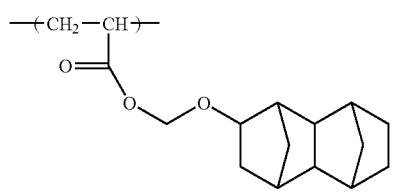
(a1-2-8)
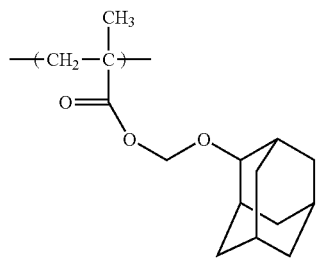
(a1-2-9)
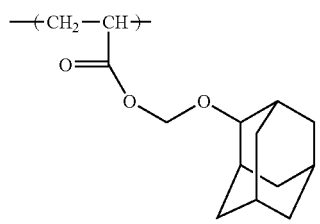
(a1-2-10)
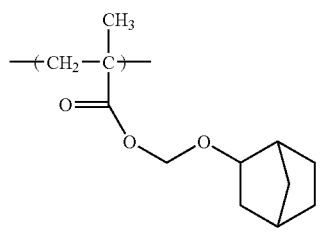
(a1-2-11)
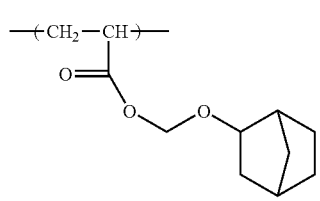
(a1-2-12)
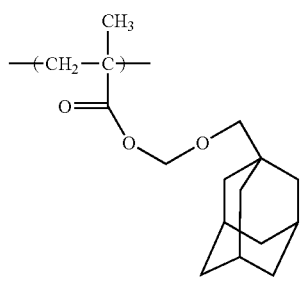
(a1-2-13)
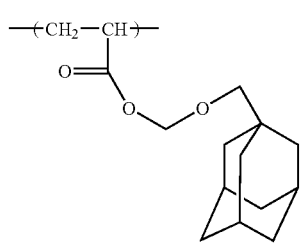
(a1-2-14)
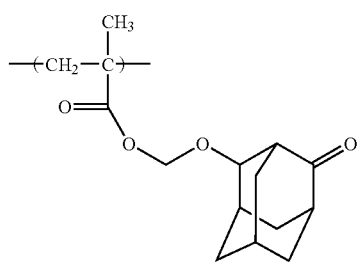
(a1-2-15)
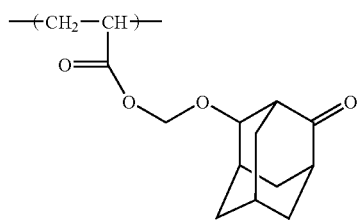
(a1-2-16)
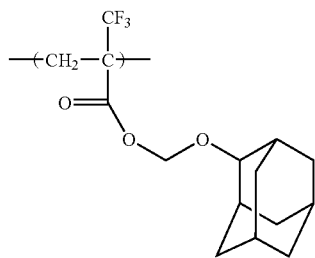
(a1-2-17)
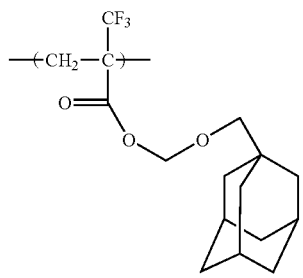
(a1-2-18)

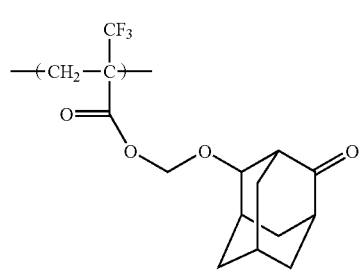
(a1-2-19)
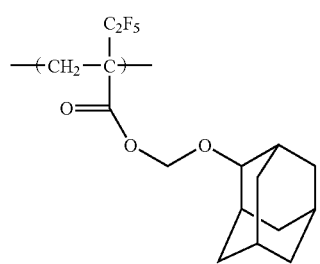
(a1-2-20)
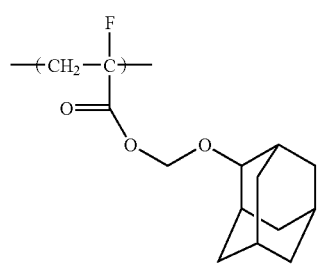
(a1-2-21)
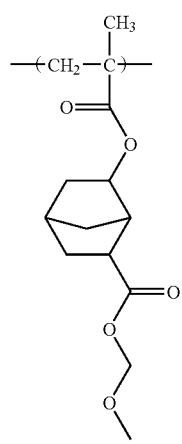
(a1-4-1)
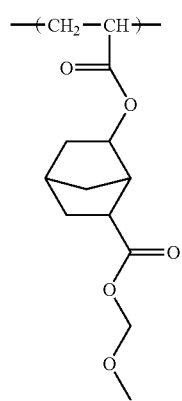
(a1-4-2)
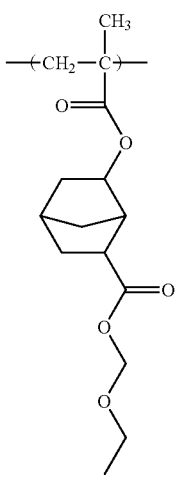
(a1-4-3)
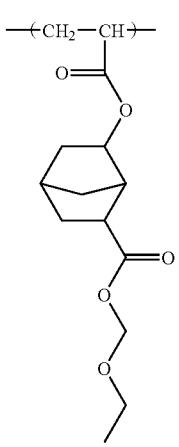
(a1-4-4)
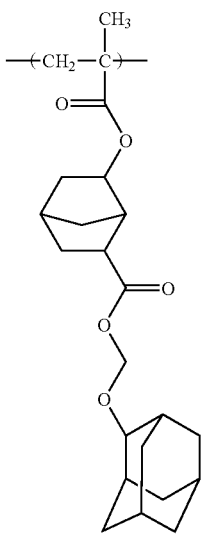
(a1-4-5)

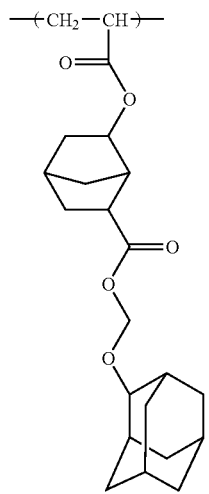
(a1-4-6)
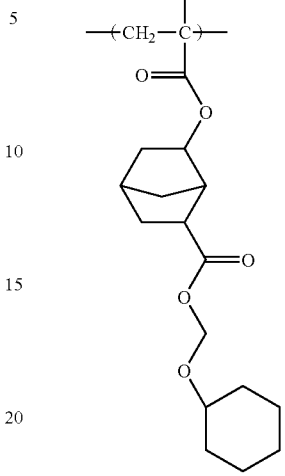
(a1-4-9)
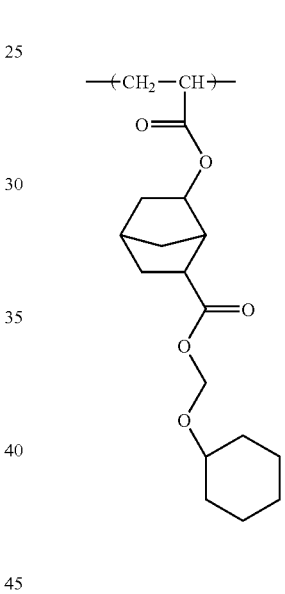
(a1-4-7)
(a1-4-10)
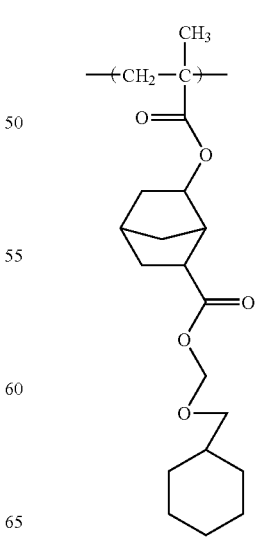
(a1-4-8)
(a1-4-11)
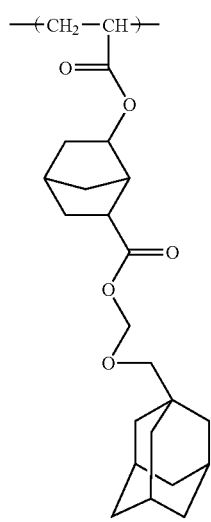

(a1-4-12) 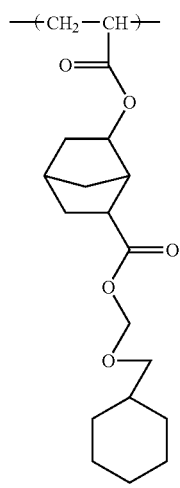
(a1-4-13) 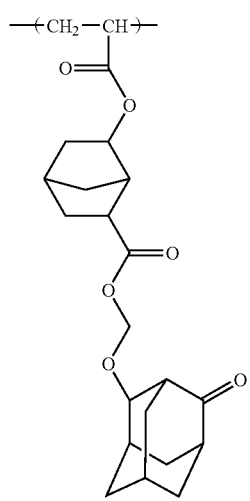
(a1-4-14) 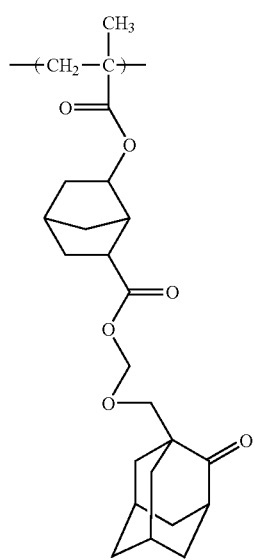
(a1-4-15) 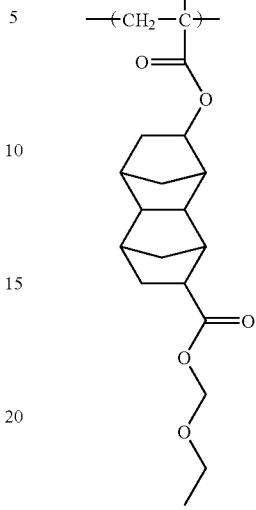
(a1-4-16) 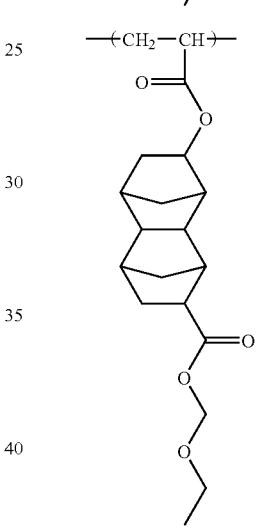
(a1-4-17) 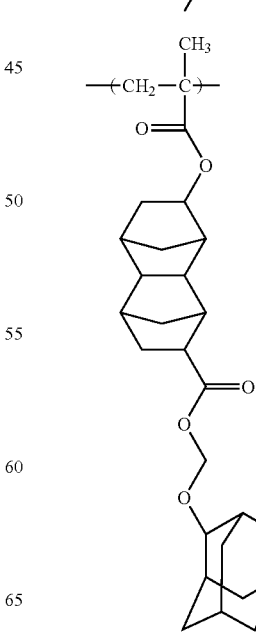

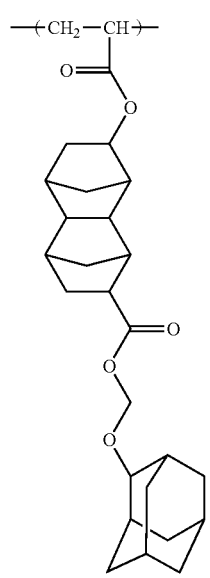 (a1-4-18)
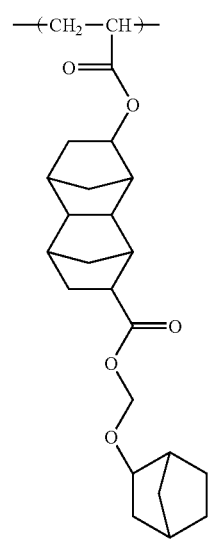 (a1-4-20)
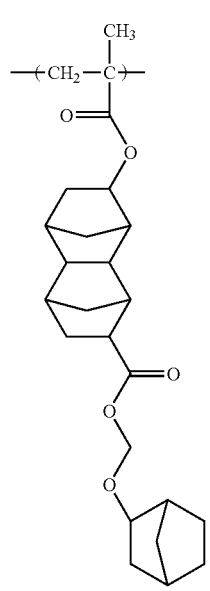 (a1-4-19)
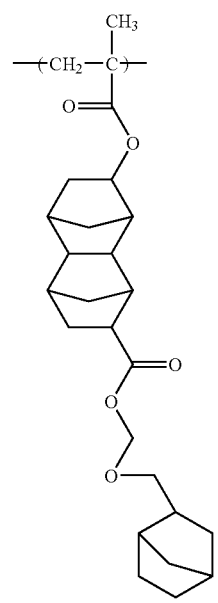 (a1-4-21)

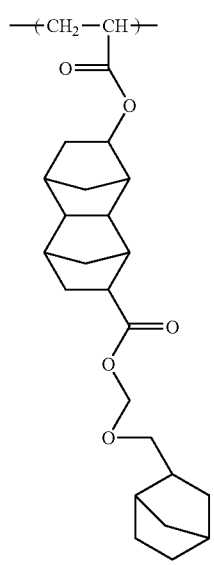 (a1-4-22)
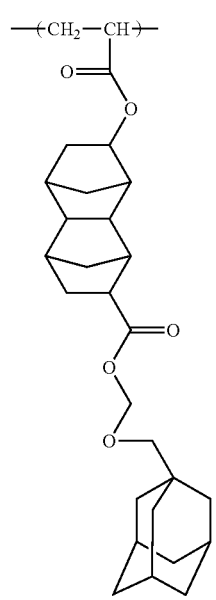 (a1-4-24)
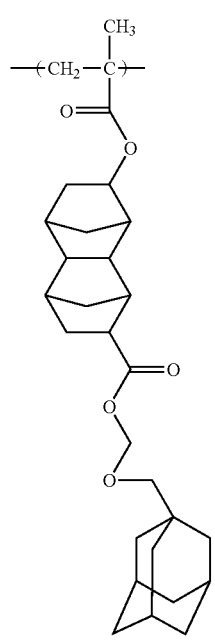 (a1-4-23)
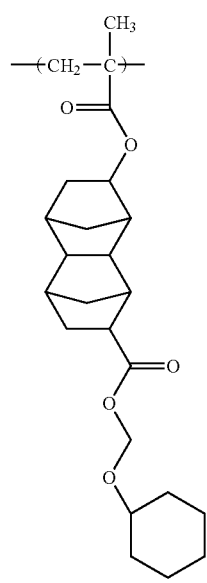 (a1-4-25)

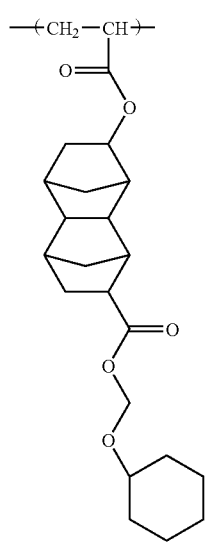
(a1-4-26)
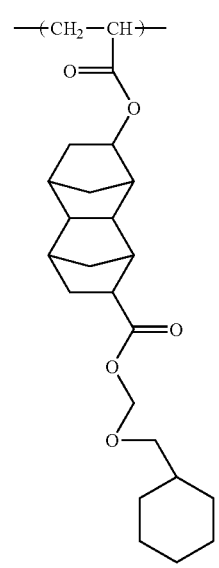
(a1-4-28)
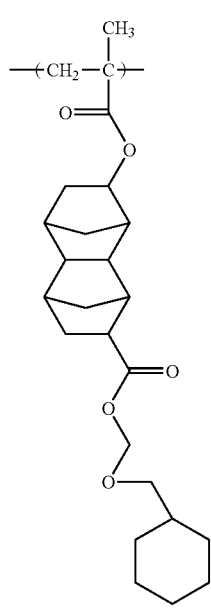
(a1-4-27)
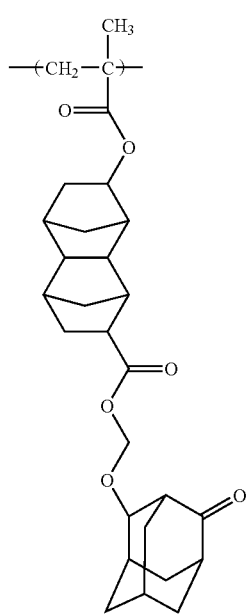
(a1-4-29)

-continued

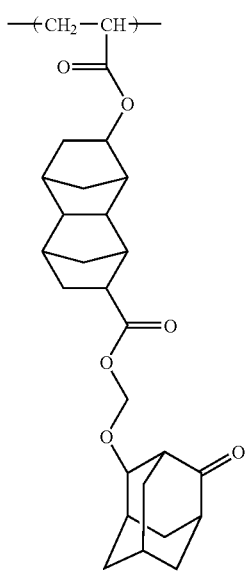

(a1-4-30)

As the structural unit (a1), structural units represented by the above general formula (a1-2) are preferred, and of these, structural units represented by a general formula (2) shown below are particularly desirable.

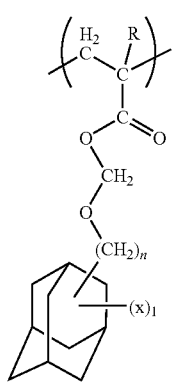

(2)

[wherein, R represents a hydrogen atom, fluorine atom, lower alkyl group, or fluorinated lower alkyl group; n represents either 0 or an integer from 1 to 3; X represents a polar group; and 1 represents either 0 or an integer from 1 to 3]

In the formula (2), R and n are the same as R and n within the above formula (a1-2).

Examples of the polar group represented by X include a hydroxyl group, cyano group, carboxyl group, or a fluorinated hydroxyalkyl group in which a portion of the hydrogen atoms bonded to carbon atoms within a hydroxyalkyl group of 1 to 5 carbon atoms have been substituted with fluorine atoms. Of these, a hydroxyl group or carboxyl group is preferred. Furthermore, X is not restricted to monovalent groups, and an oxygen atom (═O, this oxygen atom forms a carbonyl group together with a carbon atom that constitutes part of the ring structure) is also desirable.

1 is preferably either 0 or 1, and is most preferably 0.

Furthermore, X is most preferably an oxygen atom, and in such cases, the number of oxygen atoms is preferably 1.

Of the structural units represented by the above general formula (2), structural units represented by general formulas (3), (4), and (3') shown below are preferred, and of these, structural units represented by the general formulas (3) and (3') are particularly desirable. These structural units yield favorable resolution and resist pattern shape. Furthermore, the exposure area dependency is also favorable, and the exposure area margin improves, which is also desirable. The exposure area margin describes a problem wherein changes in the mask coverage ratio or the coordinates within the cell (whether a specified position is near the periphery or within the center of the cell within the apparatus) cause variation in the resist shape or dimensions. It is thought that the reason the exposure area margin improves is that because the acid-dissociable, dissolution-inhibiting group represented by the formula —C($R^1$)($R^2$)—O($CH_2$)$_n$—Y has an extremely low deprotection energy, the deprotection reaction proceeds just with the exposure energy, meaning the resist is resistant to effects resulting from dispersion or deactivation of the acid. Furthermore, even on an inorganic substrate such as a SiON substrate, a resist pattern with favorable resolution and resist pattern shape can be formed.

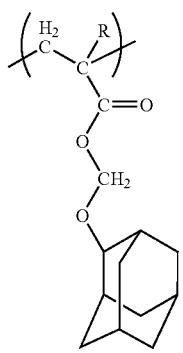

(3)

[wherein, R represents a hydrogen atom, fluorine atom, lower alkyl group, or fluorinated lower alkyl group]

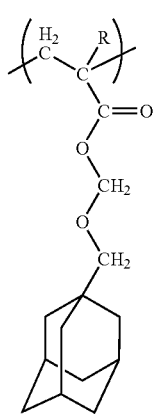

(4)

[wherein, R represents a hydrogen atom, fluorine atom, lower alkyl group, or fluorinated lower alkyl group]

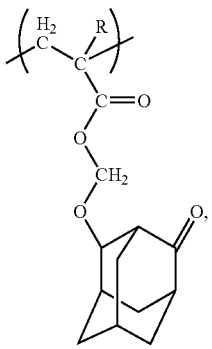

(3)

[wherein, R represents a hydrogen atom, fluorine atom, lower alkyl group, or fluorinated lower alkyl group]

As the structural unit (a1), either a single structural unit may be used alone, or a combination of two or more different structural units may be used.

The proportion of the structural unit (a1) within the component (A), relative to the combined total of all the structural units that constitute the component (A), is preferably within a range from 10 to 80 mol %, even more preferably from 20 to 60 mol %, even more preferably from 30 to 50 mol %, and is most preferably from 35 to 45 mol %. By ensuring that this proportion is at least as large as the lower limit of the above range, a very fine pattern can be obtained when the component (A) is used to form a resist composition, whereas ensuring that the proportion is no greater than the upper limit enables a more favorable balance to be achieved with the other structural units.

Structural Unit (a2)

The structural unit (a2) is a structural unit derived from an acrylate ester that contains a lactone-containing monocyclic or polycyclic group. Including the structural unit (a2) enables the effects of the present invention to be obtained. Furthermore, the structural unit (a2) also improves the adhesion between the resist film and the substrate, and reduces the likelihood of pattern collapse or film peeling, even for very fine resist patterns. Furthermore, the structural unit (a2) enhances the hydrophilicity of the component (A), thereby improving the affinity with the developing solution, improving the alkali solubility within the exposed portions of the resist, and contributing to an improvement in the resolution.

In the structural unit (a2), a hydrogen atom, fluorine atom, lower alkyl group, or fluorinated lower alkyl group is bonded to the α-position carbon atom, and specific examples include the same groups as those exemplified above in relation to the group R in the structural unit (a1).

The expression "lactone-containing monocyclic or polycyclic group" refers to a cyclic group that includes a single ring containing a —O—C(O)— structure (a lactone ring). This lactone ring is counted as the first ring, and groups that contain only the lactone ring are referred to as monocyclic groups, whereas groups that also contain other ring structures are described as polycyclic groups regardless of the structure of the other rings.

As the structural unit (a2), any group can be used without any particular restrictions, provided it includes both the above type of lactone structure (—O—C(O)—) and a cyclic group, and specific examples include structural units in which a monocyclic group formed from a lactone ring, or a polycyclic group that contains a lactone ring and an alicyclic group bonded thereto, is bonded to the ester side-chain portion of the acrylate ester.

Specifically, examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane, or tetracycloalkane. Groups obtained by removing one hydrogen atom from a lactone-containing tricycloalkane with a structural formula such as those shown below are particularly preferred in terms of factors such as industrial availability.

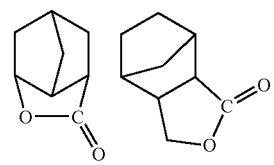

More specific examples of the structural unit (a2) include the structural units represented by general formulas (a2-1) to (a2-5) shown below.

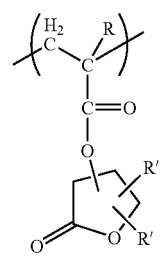

(a2-1)

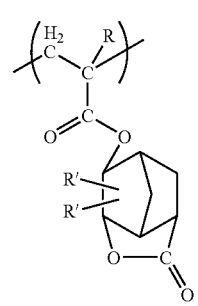

(a2-2)

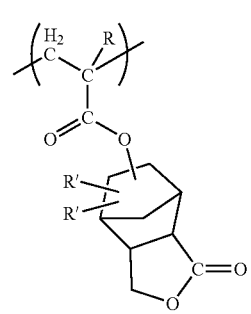

(a2-3)

(a2-4)

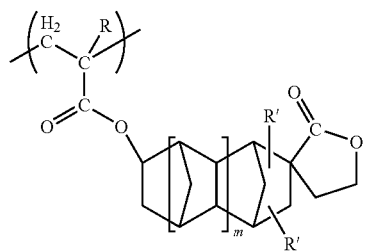

(a2-5)

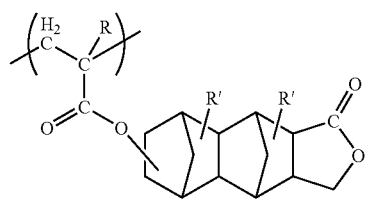

[wherein, R represents a hydrogen atom, fluorine atom, lower alkyl group or fluorinated lower alkyl group, each R' represents, independently, a hydrogen atom, a lower alkyl group, or an alkoxy group of 1 to 5 carbon atoms, and m represents an integer of 0 or 1]

The group R within the general formulas (a2-1) to (a2-5) is as defined above for R in the above structural unit (a1), and suitable examples of the group include the same groups as those exemplified above Examples of the lower alkyl group of R' include the same lower alkyl groups as those exemplified above for the group R in the structural unit (a1).

Considering factors such as industrial availability, R' within the general formulas (a2-1) to (a2-5) is preferably a hydrogen atom.

Specific examples of structural units represented by the above general formulas (a2-1) to (a2-5) are shown below.

(a2-1-1)

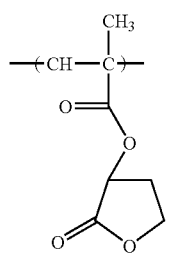

(a2-1-2)

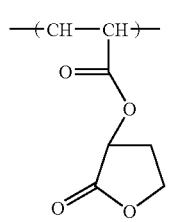

(a2-1-3)

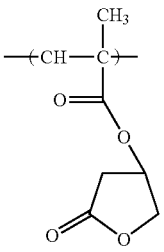

(a2-1-4)

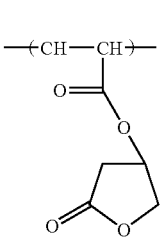

(a2-1-5)

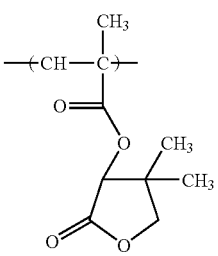

(a2-1-6)

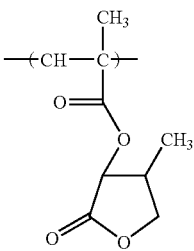

(a2-2-1)

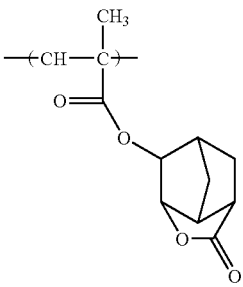

(a2-2-2)

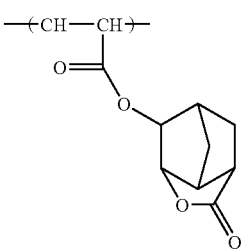

-continued
(a2-2-3)
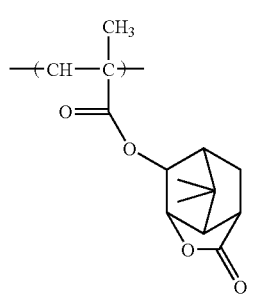
(a2-2-4)
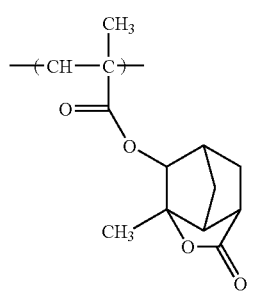
(a2-2-5)
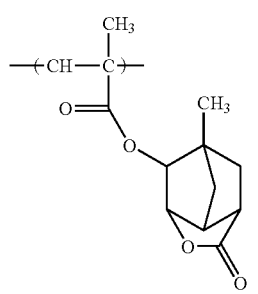
(a2-3-1)
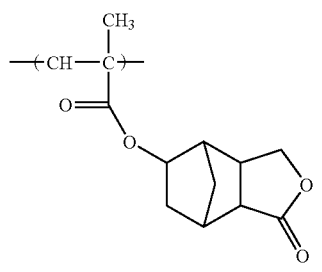
(a2-3-2)
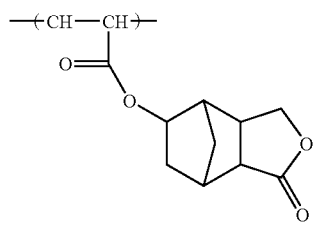
(a2-3-3)
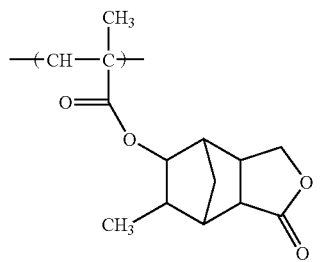
-continued
(a2-3-4)
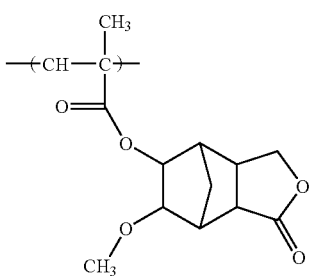
(a2-3-5)
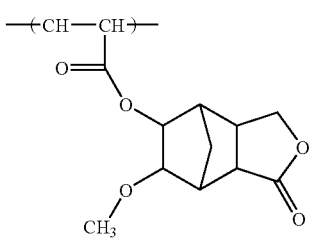
(a2-3-6)
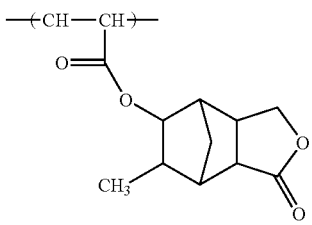
(a2-3-7)
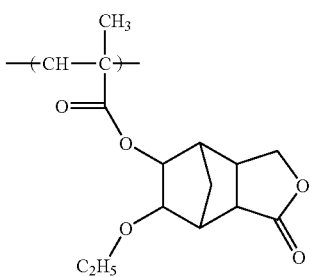
(a2-3-8)
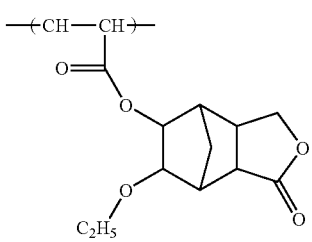
(a-2-3-9)
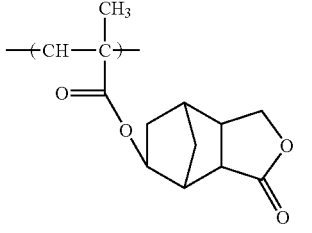

-continued
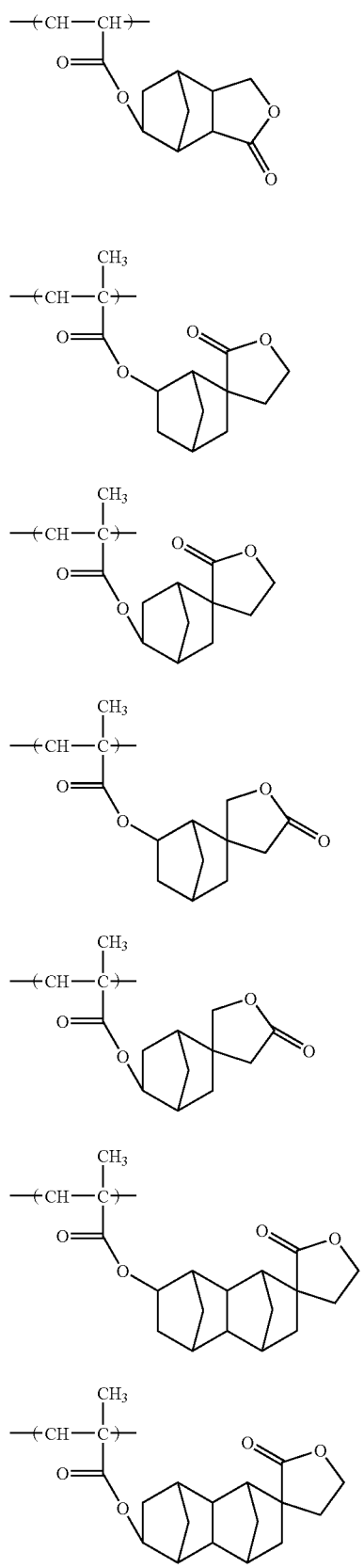
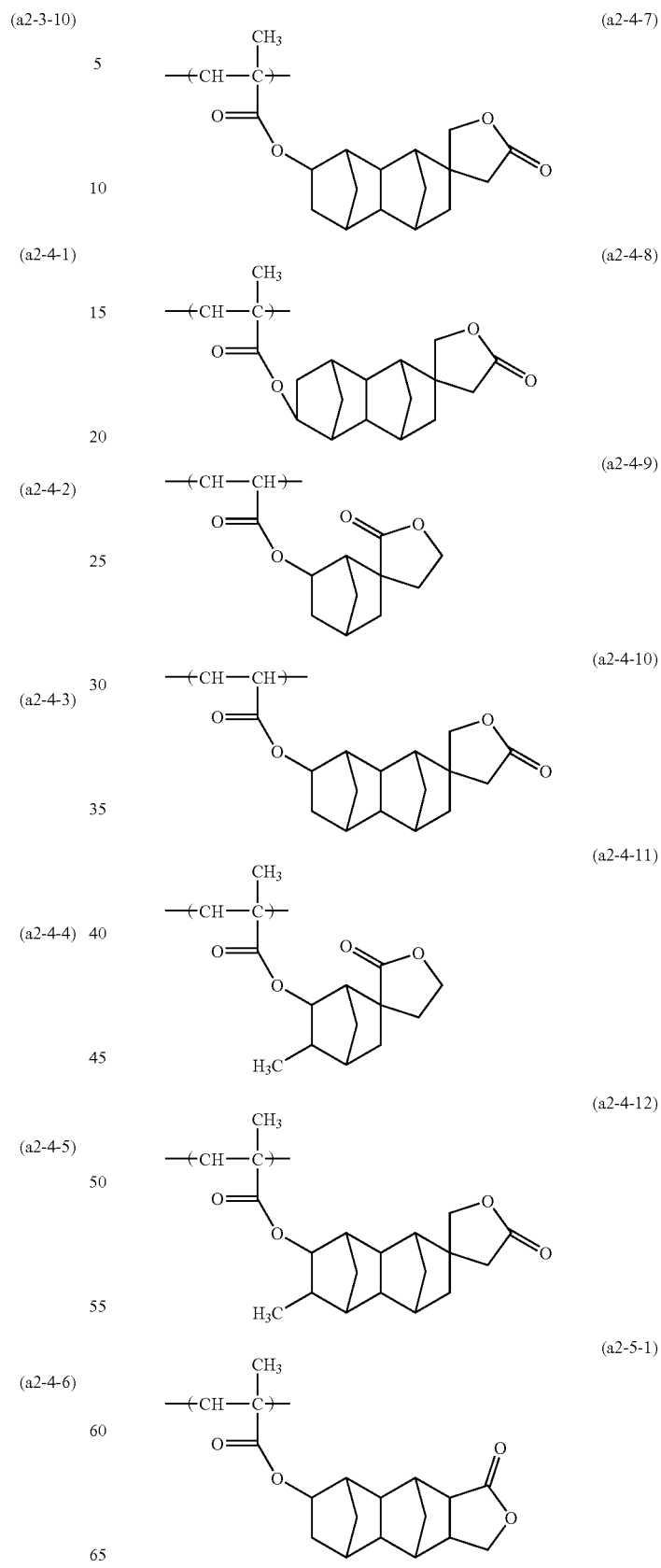

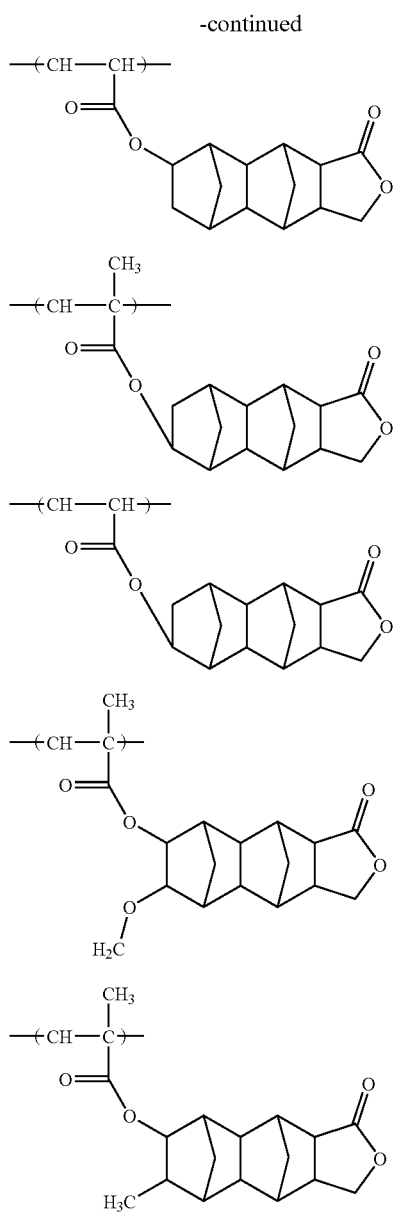

Of the above structural units, the use of one or more units selected from units of the general formulas (a2-1) to (a2-3) is preferred.

In other words, butyrolactone esters of acrylic acid represented by the general formula (a2-1), namely, structural units derived from the acrylate esters of various butyrolactones, are preferred in terms of the effects of the present invention, and of these units, structural units derived from the γ-butyrolactone ester of acrylic acid, in which all of the R' groups are hydrogen atoms and the ester linkage is formed at the α-carbon atom on the lactone skeleton, namely, structural units derived from the acrylate ester of γ-butyrolactone are the most desirable. Furthermore, structural units derived from the acrylate ester of γ-butyrolactone are also preferred in terms of their superior effect in suppressing and reducing the proximity effect.

Furthermore, norbornane lactone esters of acrylic acid represented by the general formulas (a2-2) and (a2-3), namely, structural units derived from the acrylate esters of various norbornane lactones, are also preferred as they yield a favorable resist pattern shape, and particularly favorable rectangular formability.

Specifically, the use of at least one structural unit selected from amongst the chemical formulas (a2-1-1), (a2-1-2), (a2-2-1), (a2-2-2), (a2-3-1), (a2-3-2), (a2-3-9), and (a2-3-10) is particularly preferred.

As the structural unit (a2), either a single structural unit may be used alone, or a combination of two or more different structural units may be used.

The proportion of the structural unit (a2) within the component (A), relative to the combined total of all the structural units that constitute the component (A), is preferably within a range from 10 to 80 mol %, even more preferably from 20 to 60 mol %, even more preferably from 25 to 50 mol %, and is most preferably from 35 to 50 mol %. Ensuring that this proportion is at least as large as the lower limit of the above range yields superior effects for the present invention, whereas ensuring that the proportion is no greater than the upper limit enables a more favorable balance to be achieved with the other structural units.

Structural Unit (a3)

The structural unit (a3) is a structural unit that is different from the structural unit (a1) and the structural unit (a2), and is derived from an acrylate ester that contains an aliphatic cyclic group-containing, non-acid-dissociable, dissolution-inhibiting group and contains no polar groups.

In the structural unit (a3), a hydrogen atom, fluorine atom, lower alkyl group, or fluorinated lower alkyl group is bonded to the α-position carbon atom, and specific examples include the same groups as those exemplified above in relation to the group R in the structural unit (a1).

The structural unit (a3) is different from the structural unit (a1) and the structural unit (a2). In other words, the structural unit is not represented by the above general formulas (a1-2) or (a1-4), and is not derived from an acrylate ester that contains a lactone-containing monocyclic or polycyclic group.

In the structural unit (a3), the expression "aliphatic cyclic group-containing, non-acid-dissociable, dissolution-inhibiting group" describes a group containing a cyclic group that has no aromaticity, which does not dissociate under the action of the acid generated from the component (B), and which has the function of raising the hydrophobicity of the entire component (A) both prior to, and following exposure, thereby suppressing alkali solubility. In other words, the structural unit (a3) contains a group that reduces the alkali solubility of the entire component (A) prior to exposure, and does not dissociate under the action of the acid generated from the component (B) upon exposure, but rather retains a dissolution inhibiting effect that reduces the alkali solubility of the component (A), without causing the component (A) to become alkali-insoluble when the entire component (A) changes to an alkali-soluble state upon dissociation of the acid-dissociable, dissolution-inhibiting group of the above structural unit (a1). This type of structural unit is able to increase the contact angle relative to pure water (namely, increase the hydrophobicity) following PEB (post exposure baking).

The aliphatic cyclic group can use any of the multitude of conventional groups used within the resin components of resist compositions designed for use with ArF excimer lasers or KrF excimer lasers (but particularly for ArF excimer lasers), and suitable examples include the same aliphatic cyclic groups as those exemplified above in relation to the group Y within the structural unit (a1). Polycyclic groups are particularly preferred as the aliphatic cyclic group, and at least one group selected from the group consisting of a tricyclodecanyl group, adamantyl group, tetracyclododecanyl group, isobornyl group and norbornyl group is preferred in terms of factors such as industrial availability. These polycyclic groups may be substituted with a straight-chain or branched alkyl group of 1 to 5 carbon atoms.

Furthermore, the structural unit (a3) must not contain any polar groups. Examples of polar groups include a hydroxyl group, cyano group, carboxyl group, or a fluorinated hydroxyalkyl group in which a portion of the hydrogen atoms bonded to carbon atoms within a hydroxyalkyl group of 1 to 5 carbon atoms have been substituted with fluorine atoms.

Furthermore, the structural unit (a3) preferably does not contain an acid-dissociable, dissolution-inhibiting group.

Examples of the structural unit (a3) include structural units in which the aforementioned aliphatic cyclic group-containing, non-acid-dissociable, dissolution-inhibiting group is bonded to the ester portion of an acrylate ester.

Specific examples of the structural unit (a3) include structural units represented by a general formula (a3-1) shown below.

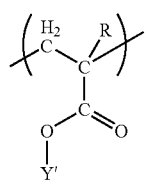

(a3-1)

[wherein, R represents a hydrogen atom, fluorine atom, lower alkyl group, or fluorinated lower alkyl group, Y' represents an aliphatic cyclic group in which the basic ring structure contains from 4 to 15 carbon atoms, and the basic ring structure may include from 1 to 3 alkyl groups of 1 to 10 carbon atoms]

Y' represents an aliphatic cyclic group (which may be either monocyclic or polycyclic) in which the basic ring structure (the ring structure without any substituent groups) contains from 4 to 15 carbon atoms, and is preferably an alicyclic group. Of the various possibilities, a cyclohexyl group, cyclopentyl group, adamantyl group, norbornyl group, or tetracyclododecanyl group is preferred from the viewpoint of industrial availability.

The aliphatic cyclic group may include from 1 to 3 alkyl groups of 1 to 10 carbon atoms. These alkyl groups are preferably straight-chain or branched alkyl groups of 1 to 5 carbon atoms, and suitable examples include a methyl group, ethyl group, propyl group, isopropyl group, n-butyl group, isobutyl group, pentyl group, isopentyl group, and neopentyl group. The number of these alkyl groups is preferably either 0 or 1, and is most preferably 0.

As the structural unit (a3), structural units represented by general formulas (a3-11) to (a3-15) shown below are preferred, and structural units represented by the formulas (a3-11) to (a3-13) are particularly desirable in terms of factors such as industrial availability. Of the various units, structural units represented by the general formula (a3-11) are preferred as the yield a more favorable resist pattern shape, including more favorable rectangular formability. Furthermore, such structural units are also preferred in terms of suppression of pattern collapse.

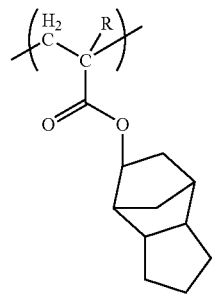

(a3-11)

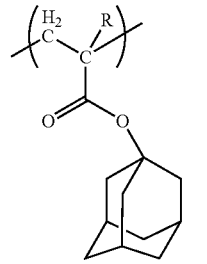

(a3-12)

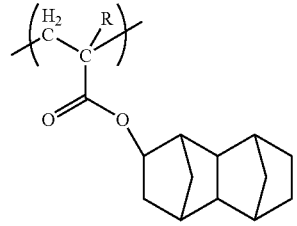

(a3-13)

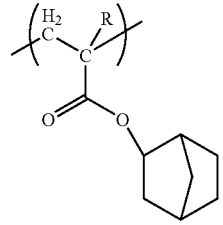

(a3-14)

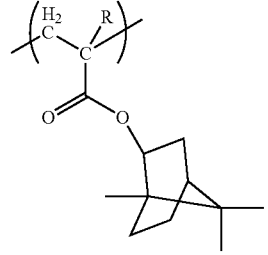

(a3-15)

[wherein, R represents a hydrogen atom, fluorine atom, lower alkyl group, or fluorinated lower alkyl group]

As the structural unit (a3), either a single structural unit may be used alone, or a combination of two or more different structural units may be used.

The proportion of the structural unit (a3) within the component (A), relative to the combined total of all the structural units that constitute the component (A), is preferably within a range from 3 to 50 mol %, even more preferably from 5 to 35 mol %, and is most preferably from 15 to 30 mol %. Ensuring that this proportion is at least as large as the lower limit of the above range yields superior effects for the present invention, whereas ensuring that the proportion is no greater than the upper limit enables a more favorable balance to be achieved with the other structural units.

In the present invention, the component (A) is preferably a copolymer that includes all of the structural units (a1) to (a3), and is most preferably a copolymer formed solely from the structural units (a1) to (a3). Such copolymers exhibit superior effects for the present invention. Furthermore, they also exhibit favorable exposure area dependency. Moreover, they also produce favorable resolution and a favorable resist pattern shape even on inorganic substrates such as a SiON substrate.

Examples of these copolymers include copolymers that include at least the three structural units represented by the general formulas shown below.

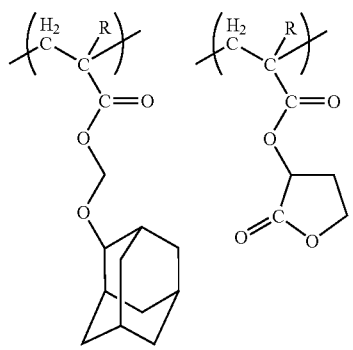

-continued

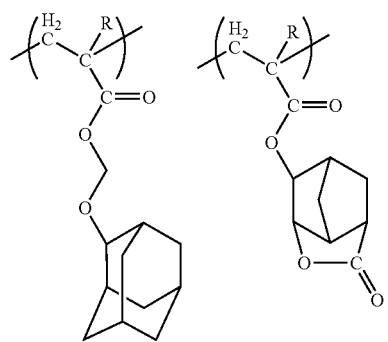

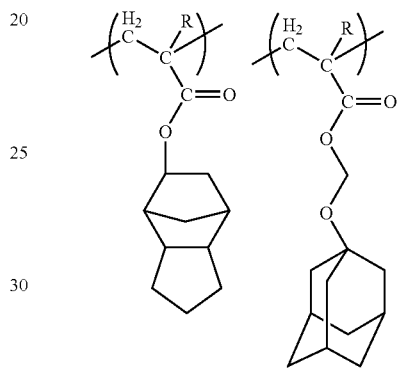

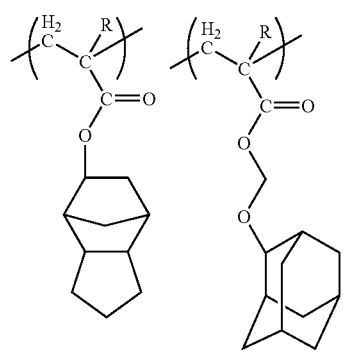

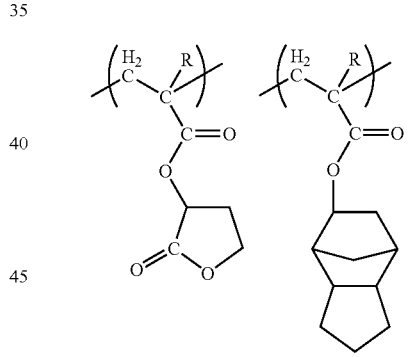

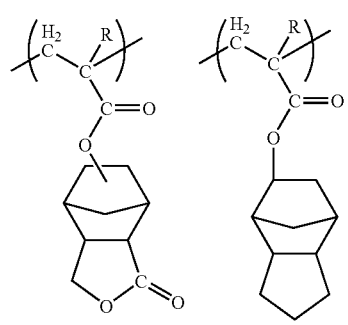

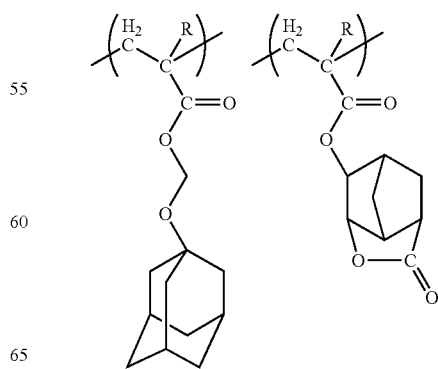

-continued
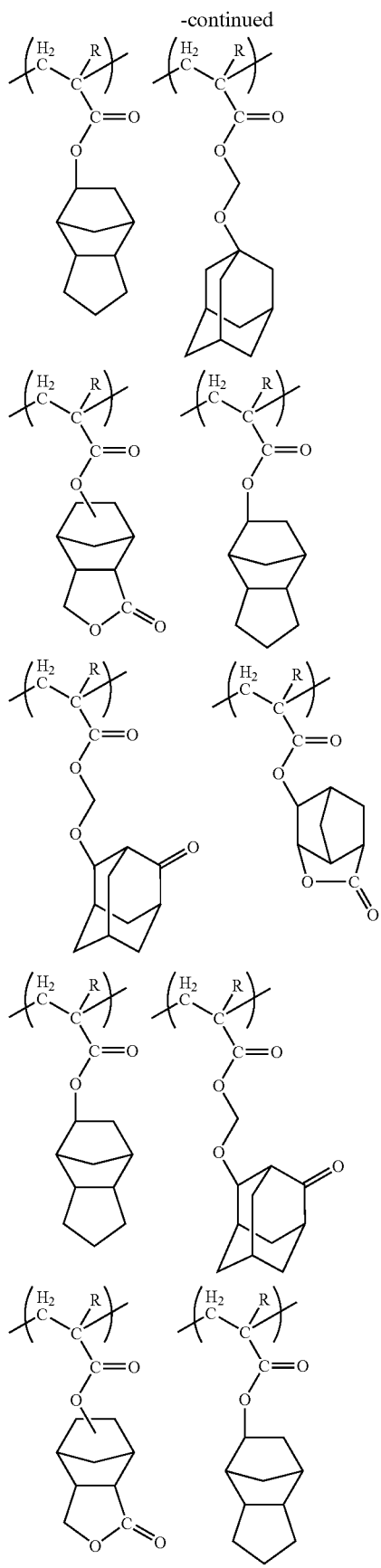
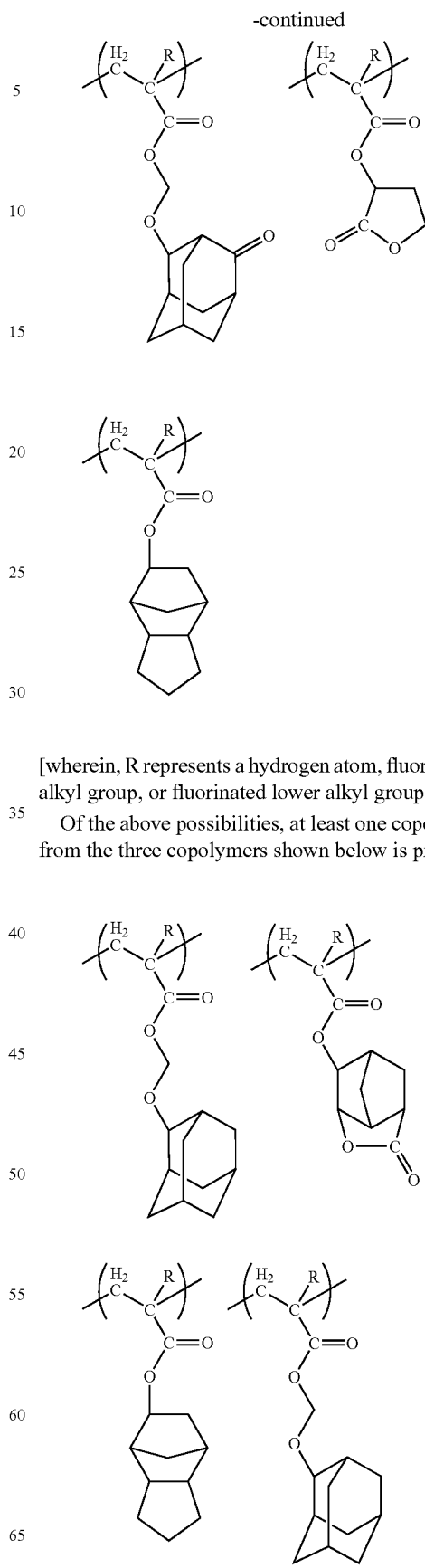
[wherein, R represents a hydrogen atom, fluorine atom, lower alkyl group, or fluorinated lower alkyl group]
Of the above possibilities, at least one copolymer selected from the three copolymers shown below is preferred.

-continued

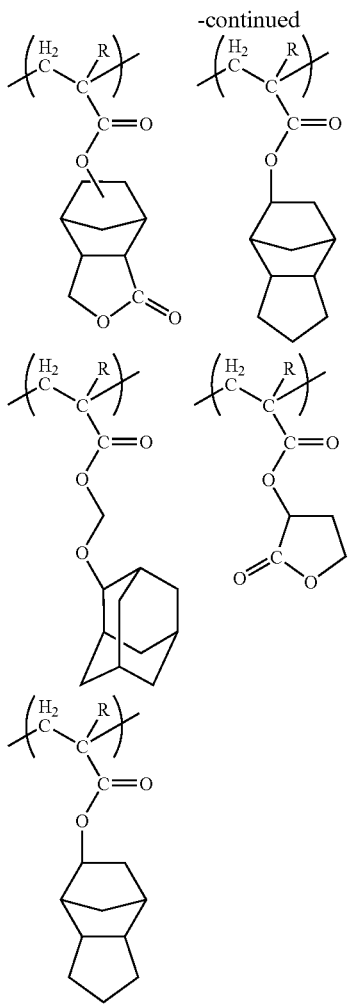

[wherein, R represents a hydrogen atom, fluorine atom, lower alkyl group, or fluorinated lower alkyl group]

Other Structural Units

The component (A) may also include structural units other than the structural units (a1) to (a3) described above, provided such inclusion does not impair the effects of the present invention, and the types of monomer components used within the base resins of conventional chemically amplified positive resist compositions, including carboxylic acids containing an ethylenic double bond that are used to impart alkali solubility, such as conventional acrylic acid derivatives, methacrylic acid derivatives, acrylic acid, methacrylic acid, maleic acid and fumaric acid, as well as other conventional monomers used in the production of acrylic resins may be added to the composition and copolymerized as required.

The component (A) can be obtained, for example, by a conventional radical polymerization or the like of the monomers that give rise to each of the structural units, using a radical polymerization initiator such as azobisisobutyronitrile (AIBN).

Furthermore, by also using a chain transfer agent such as HS—$CH_2$—$CH_2$—$CH_2$—$C(CF_3)_2$—OH during the above polymerization, —$C(CF_3)_2$—OH groups may be introduced at the copolymer terminals of the component (A). A copolymer wherein hydroxyalkyl groups, in which a portion of the hydrogen atoms of the alkyl group have been substituted with fluorine atoms, have been introduced in this manner is effective in reducing the levels of developing defects and LER.

Although there are no particular restrictions on the weight average molecular weight (Mw; the polystyrene equivalent value determined by gel permeation chromatography (GPC), this also applies to subsequent molecular weight values) of the component (A), the molecular weight value is preferably no greater than 30,000, and is even more preferably 15,000 or less. Provided the weight average molecular weight is no greater than 30,000, the composition exhibits excellent etching resistance, the resist pattern is resistant to swelling during developing, and pattern collapse is unlikely.

There are no particular restrictions on the lower limit for the weight average molecular weight, although considering factors such as the resolution and the solubility within organic solvents, the weight average molecular weight is preferably at least 3,000, and even more preferably 5,000 or greater.

Polydispersity values of no more than 3.0, and preferably within a range from 1.0 to 2.5 are preferred in terms of improving the resolution and heat resistance.

The component (A) may contain either a single copolymer or a combination of two or more different copolymers.

The quantity of the component (A) within the positive resist composition of the present invention can be adjusted appropriately in accordance with the thickness of the resist film that is to be formed.

<Component (B)>

In the present invention, the component (B) includes an onium salt (B1) having an anion portion represented by a general formula (B-01) shown below:

$$R^{41}\text{—}SO_3^-  \qquad (B\text{-}01)$$

[wherein, $R^{41}$ represents an alkyl group or fluoroalkyl group that contains a cyclic group of 4 to 12 carbon atoms].

In the formula (B-01), the alkyl group that contains a "cyclic group of 4 to 12 carbon atoms" represented by $R^{41}$ may simply be a cyclic alkyl group of 4 to 12 carbon atoms, or may be a chain-like (straight-chain or branched-chain) alkyl group in which at least one hydrogen atom has been substituted with a cyclic alkyl group of 4 to 12 carbon atoms.

The "cyclic alkyl group of 4 to 12 carbon atoms" may be either a monocyclic group or a polycyclic group. As the monocyclic group, groups in which one hydrogen atom has been removed from a monocycloalkane of 4 to 6 carbon atoms are preferred, and specific examples include a cyclopentyl group and cyclohexyl group. The polycyclic group preferably contains from 7 to 12 carbon atoms, and specific examples include an adamantyl group, norbornyl group, isobornyl group, tricyclodecanyl group, and tetracyclododecanyl group. Of these possibilities, polycyclic groups are preferred, and an adamantyl group, norbornyl group, or tetracyclododecanyl group is preferred from an industrial viewpoint, with a norbornyl group being particularly desirable.

These cyclic groups may contain a substituent group, or may contain no substituent groups. Examples of suitable substituent groups include lower alkyl groups of 1 to 5 carbon atoms, a fluorine atom, fluorinated lower alkyl groups of 1 to 5 carbon atoms that have been substituted with fluorine atoms, and an oxygen atom (=O).

In a "chain-like alkyl group in which at least one hydrogen atom has been substituted with a cyclic alkyl group of 4 to 12 carbon atoms", examples of the cyclic alkyl group of 4 to 12 carbon atoms include the same groups as those described above. The chain-like alkyl group is preferably a lower alkyl group of 1 to 5 carbon atoms, and suitable examples include a methyl group, ethyl group, propyl group, isopropyl group, n-butyl group, isobutyl group, tert-butyl group, pentyl group, isopentyl group, and neopentyl group. Straight-chain alkyl groups are particularly preferred, and from an industrial viewpoint, a methyl group or ethyl group is the most desirable.

Examples of the fluoroalkyl group containing a cyclic group of 4 to 12 carbon atoms represented by $R^{41}$ include groups in which a portion of, or all of, the hydrogen atoms within an aforementioned alkyl group that contains a cyclic group of 4 to 12 carbon atoms have been substituted fluorine atoms.

Specific examples of the anion portion represented by the formula (B-01) are shown below.

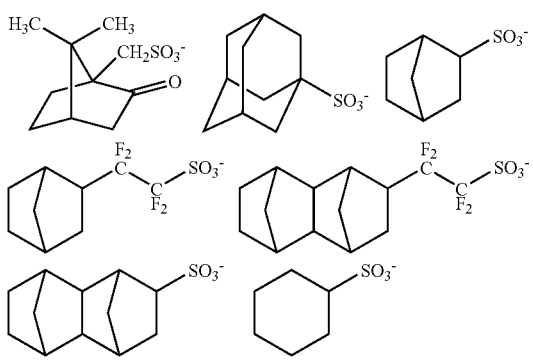

In the present invention, compounds in which the anion portion represented by the formula (B-01) is a camphorsulfonate ion are preferred as they produce superior effects for the present invention, and compounds in which the camphorsulfonate ion is an ion represented by the chemical formula shown below (namely, an ion in which a sulfonate ion ($-SO_3^-$) is bonded to the carbon atom of the methyl group bonded to position 1 of the norbornane ring) are particularly preferred.

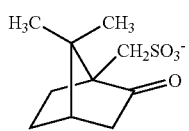

There are no particular restrictions on the cation portion within the onium salt (B1), and any of the cation portions used within conventional onium salt-based acid generators can be used. Examples of the cation portion include cation portions represented by general formulas (B-02) and (B-03) shown below.

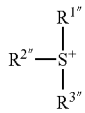
(B-02)

(B-03)

[wherein, $R^{1'''}$ to $R^{3'''}$, and $R^{5'''}$ to $R^{6'''}$ each represent, independently, an aryl group or an alkyl group; provided that at least one of $R^{1'''}$ to $R^{3'''}$ represents an aryl group, and at least one of $R^{5'''}$ to $R^{6'''}$ represents an aryl group]

In the formula (B-02), $R^{1'''}$ to $R^{3'''}$ each represent, independently, an aryl group or an alkyl group. Of the groups $R^{1'''}$ to $R^{3'''}$ at least one group represents an aryl group. Compounds in which at least two of $R^{1'''}$ to $R^{3'''}$ represent aryl groups are preferred, and compounds in which all of $R^{1'''}$ to $R^{3'''}$ are aryl groups are the most preferred.

There are no particular restrictions on the aryl groups of $R^{1'''}$ to $R^{3'''}$, and suitable examples include aryl groups of 6 to 20 carbon atoms, in which either a portion of, or all of, the hydrogen atoms of these aryl groups may be either substituted, or not substituted, with alkyl groups, alkoxy groups, or halogen atoms and the like. In terms of enabling low-cost synthesis, aryl groups of 6 to 10 carbon atoms are preferred. Specific examples of suitable groups include a phenyl group and a naphthyl group.

Alkyl groups that may be used for substitution of the hydrogen atoms of the above aryl groups are preferably alkyl groups of 1 to 5 carbon atoms, and a methyl group, ethyl group, propyl group, n-butyl group or tert-butyl group is the most desirable.

Alkoxy groups that may be used for substitution of the hydrogen atoms of the above aryl groups are preferably alkoxy groups of 1 to 5 carbon atoms, and a methoxy group or ethoxy group is the most desirable.

Halogen atoms that may be used for substitution of the hydrogen atoms of the above aryl groups are preferably fluorine atoms.

There are no particular restrictions on the alkyl groups of $R^{1'''}$ to $R^{3'''}$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low-cost synthesis, a methyl group is the most desirable.

Of the above possibilities, the groups $R^{1'''}$ to $R^{3'''}$ are preferably phenyl groups or naphthyl groups that either contain no substituent groups, or contain substituent groups such as alkyl groups or alkoxy groups, and at least two of the groups $R^{1'''}$ to $R^{3'''}$ are preferably phenyl groups that contain no substituent groups.

In the formula (B-03), $R^{5'''}$ to $R^{6'''}$ each represent, independently, an aryl group or an alkyl group.

Suitable examples of the aryl groups of the groups $R^{5'''}$ to $R^{6'''}$ include the same aryl groups as those described above for the groups $R^{1'''}$ to $R^{3'''}$.

Suitable examples of the alkyl groups of the groups $R^{1'''}$ to $R^{6'''}$ include the same alkyl groups as those described above for the groups $R^{1'''}$ to $R^{3'''}$.

At least one of $R^{5'''}$ to $R^{6'''}$ represents an aryl group. Compounds in which R to $R^{6'''}$ all represent aryl groups are preferred, and compounds in which $R^{5'''}$ to $R^{6'''}$ are all phenyl groups are the most preferred.

The onium salt (B1) may use either a single compound, or a combination of two or more different compounds.

In order to ensure favorable effects for the present invention, the proportion of the onium salt (B1) within the component (B) is preferably within a range from 5 to 50% by weight, even more preferably from 5 to 40% by weight, even more preferably from 10 to 30% by weight, and is most preferably from 15 to 30% by weight.

Including another onium salt (B2) besides the onium salt (B1) within the component (B) is preferred as it yields superior sensitivity. There are no particular restrictions on the onium salt (B2) provided it does not coincide with the onium salt (B1), and any of the onium salt-based acid generators proposed for use within conventional chemically amplified resists can be used. Examples of these onium salts (B2) are numerous, and include various iodonium salts and sulfonium salts.

In the present invention, the component (B) preferably includes at least one of the onium salts (B2-1) and (B2-2) shown below as the onium salt (B2).

The onium salt (B2-1) is an onium salt represented by a general formula (b-1) or (b-2) shown below.

[wherein, $R^{1''}$ to $R^{3''}$, and $R^{5''}$ to $R^{6''}$ each represent, independently, an aryl group or an alkyl group; and $R^{4''}$ represents a straight-chain or branched alkyl group or fluoroalkyl group; provided that at least one of $R^{1''}$ to $R^{3''}$ represents an aryl group, and at least one of $R^{5''}$ to $R^{6''}$ represents an aryl group]

Examples of $R^{1''}$ to $R^{3''}$, and $R^{5''}$ to $R^{6''}$ within the formulas (b-1) and (b-2) include the same groups as those exemplified above in relation to $R^{1''}$ to $R^{3''}$, and $R^{5''}$ to $R^{6''}$ within the formulas (B-02) and (B-03).

The group $R^{4''}$ represents a straight-chain or branched alkyl group or fluoroalkyl group.

As the straight-chain or branched alkyl group, groups of 1 to 10 carbon atoms are preferred, groups of 1 to 8 carbon atoms are even more preferred, and groups of 1 to 4 carbon atoms are the most desirable.

As the fluoroalkyl group, groups of 1 to 10 carbon atoms are preferred, groups of 1 to 8 carbon atoms are even more preferred, and groups of 1 to 4 carbon atoms are the most desirable. Furthermore, the fluorination ratio of the fluoroalkyl group (namely, the fluorine atom proportion within the alkyl group) is preferably within a range from 10 to 100%, and even more preferably from 50 to 100%, and groups in which all of the hydrogen atoms have been substituted with fluorine atoms yield the strongest acids, and are consequently the most desirable.

The group $R^{4''}$ is most preferably a straight-chain alkyl group or a fluoroalkyl group.

Specific examples of the onium salt (B2-1) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. Further examples include onium salts in which the anion portion of the above onium salts has been substituted with a chain-like alkylsulfonate ion such as a methanesulfonate, n-propanesulfonate, n-butanesulfonate or n-octanesulfonate ion.

In those cases where an onium salt (B2-1) is included, the proportion of the onium salt (B2-1) within the component (B) is preferably within a range from 5 to 40% by weight, even more preferably from 5 to 30% by weight, even more preferably from 5 to 25% by weight, and is most preferably from 5 to 20% by weight.

The onium salt (B2-2) is an onium salt that contains an anion portion represented by a general formula (b-3) or (b-4) shown below.

[wherein, X" represents an alkylene group of 2 to 6 carbon atoms in which at least one hydrogen atom has been substituted with a fluorine atom; and Y" and Z" each represent, independently, an alkyl group of 1 to 10 carbon atoms in which at least one hydrogen atom has been substituted with a fluorine atom]

The group X" is a straight-chain or branched alkylene group in which at least one hydrogen atom has been substituted with a fluorine atom, and the number of carbon atoms within the alkylene group is typically within a range from 2 to 6, preferably from 3 to 5, and is most preferably 3.

Y" and Z" each represent, independently, a straight-chain or branched alkyl group in which at least one hydrogen atom has been substituted with a fluorine atom, and the number of carbon atoms within the alkyl group is typically within a range from 1 to 10, preferably from 1 to 7, and is most preferably from 1 to 3.

Within the above ranges for the numbers of carbon atoms, lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene groups or perfluoroalkyl groups in which all of the hydrogen atoms have been substituted with fluorine atoms are the most desirable.

Specific examples of the onium salt (B2-2) include salts in which the anion portion ($R^{4"}SO_3^-$) within the above onium salt (B2-1) has been substituted with an anion portion represented by the above general formula (b-3) or (b-4) (namely salts of the general formula (b-1) or (b-2) in which the $R^{4"}SO_3^-$ anion has been replaced with an anion portion represented by either of the general formulas (b-3) or (b-4)).

In those cases where an onium salt (B2-2) is included, the proportion of the onium salt (B2-2) within the component (B) is preferably within a range from 20 to 90% by weight, even more preferably from 30 to 80% by weight, even more preferably from 40 to 70% by weight, and is most preferably from 50 to 70% by weight.

The onium salt (B2) may use either a single compound, or a combination of two or more different compounds. In the present invention, compositions that include both the onium salt (B2-1) and the onium salt (B2-2) are particularly preferred.

In those cases where an onium salt (B2) is included, the proportion of the onium salt (B2) within the component (B) is preferably within a range from 60 to 95% by weight, even more preferably from 60 to 85% by weight, even more preferably from 65 to 85% by weight, and is most preferably from 70 to 85% by weight.

In addition to the onium salt (B1), or in addition to the combination of the onium salts (B1) and (B2), the component (B) may also include an acid generator (B3) other than an onium salt-based acid generator.

The acid generator (B3) can use any of the known acid generators proposed for use within conventional chemically amplified resist compositions (with the exception of onium salt-based acid generators). Examples of this type of acid generator (B3) are numerous, and include oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

In the present invention, the term "oxime sulfonate-based acid generator" describes a compound that contains at least one group represented by a general formula (B-1) shown below, and generates acid upon irradiation. These types of oxime sulfonate-based acid generators are widely used within chemically amplified resist compositions, and any of these conventional compounds can be used.

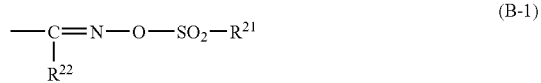
(B-1)

(In the formula (B-1), $R^{21}$ and $R^{22}$ each represent, independently, an organic group.)

In the above formula, the organic group of $R^{21}$ preferably includes a carbon atom, and may also include atoms other than the carbon atom (such as a hydrogen atom, oxygen atom, nitrogen atom, sulfur atom, or halogen atom (such as a fluorine atom or chlorine atom)).

The organic group of $R^{21}$ is preferably a straight-chain, branched or cyclic alkyl group or aryl group. These alkyl groups or aryl groups may also include a substituent group. There are no particular restrictions on such substituent groups, and suitable examples include a fluorine atom or a straight-chain, branched or cyclic alkyl group of 1 to 6 carbon atoms. Here, the expression "include a substituent group" means that either a portion of, or all of, the hydrogen atoms of the alkyl group or aryl group may be substituted with substituent groups.

The alkyl group preferably contains from 1 to 20 carbon atoms, even more preferably from 1 to 10 carbon atoms, even more preferably from 1 to 8 carbon atoms, even more preferably from 1 to 6 carbon atoms, and most preferably from 1 to 4 carbon atoms. Furthermore, alkyl groups that are partially or completely halogenated (hereafter also referred to as haloalkyl groups) are preferred. A partially halogenated alkyl group is an alkyl group in which a portion of the hydrogen atoms have been substituted with halogen atoms, whereas a completely halogenated alkyl group is an alkyl group in which all of the hydrogen atoms have been substituted with halogen atoms. Examples of the halogen atoms include fluorine atoms, chlorine atoms, bromine atoms or iodine atoms, although fluorine atoms are particularly desirable. In other words, the haloalkyl group is preferably a fluoroalkyl group.

The aryl group preferably contains from 4 to 20 carbon atoms, even more preferably from 4 to 10 carbon atoms, and most preferably from 6 to 10 carbon atoms. Aryl groups that are partially or completely halogenated are preferred. A partially halogenated aryl group is an aryl group in which a portion of the hydrogen atoms have been substituted with halogen atoms, whereas a completely halogenated aryl group is an aryl group in which all of the hydrogen atoms have been substituted with halogen atoms.

As the group $R^{21}$, an alkyl group of 1 to 4 carbon atoms containing no substituent groups, or a fluoroalkyl group of 1 to 4 carbon atoms is the most desirable.

The organic group of $R^{22}$ is preferably a straight-chain, branched or cyclic alkyl group, an aryl group, or a cyano group. Examples of suitable alkyl groups and aryl groups for $R^{22}$ include the same alkyl groups and aryl groups described above in relation to $R^2$.

As the group $R^{22}$, a cyano group, an alkyl group of 1 to 8 carbon atoms containing no substituent groups, or a fluoroalkyl group of 1 to 8 carbon atoms is the most desirable.

Particularly preferred oxime sulfonate-based acid generators include the compounds represented by the general formulas (B-2) and (B-3) shown below.

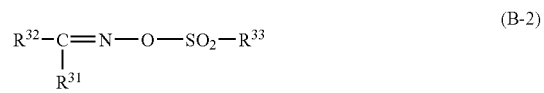
(B-2)

[In the formula (B-2), $R^{31}$ represents a cyano group, an alkyl group containing no substituent groups, or a haloalkyl group. $R^{32}$ represents an aryl group. $R^{33}$ represents an alkyl group containing no substituent groups, or a haloalkyl group.]

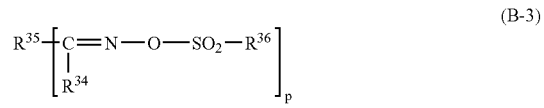
(B-3)

[In the formula (B-3), $R^{34}$ represents a cyano group, an alkyl group containing no substituent groups, or a haloalkyl group. $R^{35}$ represents a bivalent or trivalent aromatic hydrocarbon group. $R^{36}$ represents an alkyl group containing no substituent groups, or a haloalkyl group. p is either 2 or 3.]

In the above general formula (B-2), the alkyl group containing no substituent groups or haloalkyl group represented by $R^{31}$ preferably contains from 1 to 10 carbon atoms, even more preferably from 1 to 8 carbon atoms, and most preferably from 1 to 6 carbon atoms.

The group $R^{31}$ is preferably a haloalkyl group, and even more preferably a fluoroalkyl group.

In the fluoroalkyl group of $R^{31}$, at least 50% of the hydrogen atoms of the alkyl group are preferably fluorinated, and this ratio is even more preferably 70% or higher, and is most preferably 90% or higher.

The aryl group represented by $R^{32}$ is preferably a group in which one hydrogen atom has been removed from an aromatic hydrocarbon ring, such as a phenyl group, biphenylyl group, fluorenyl group, naphthyl group, anthracyl (anthryl) group or phenanthryl group, or a heteroaryl group in which a portion of the carbon atoms that constitute the ring structure within the above groups have been substituted with a hetero atom such as an oxygen atom, sulfur atom or nitrogen atom. Of these possibilities, a fluorenyl group is particularly preferred.

The aryl group of $R^{32}$ may include a substituent group such as an alkyl group, haloalkyl group or alkoxy group of 1 to 10 carbon atoms. The alkyl group or haloalkyl group within the substituent groups preferably contain from 1 to 8 carbon atoms, and even more preferably 1 to 4 carbon atoms. Furthermore, the haloalkyl group is preferably a fluoroalkyl group.

The alkyl group containing no substituent groups or haloalkyl group represented by $R^{33}$ preferably contains from 1 to 10 carbon atoms, even more preferably from 1 to 8 carbon atoms, and most preferably from 1 to 6 carbon atoms.

The group $R^{33}$ is preferably a haloalkyl group, even more preferably a fluoroalkyl group, and is most preferably a partially fluorinated alkyl group.

In the fluoroalkyl group of $R^{33}$, at least 50% of the hydrogen atoms of the alkyl group are preferably fluorinated, and groups in which 70% or more, and even more preferably 90% or more, of the hydrogen atoms are fluorinated are particularly desirable as they increase the strength of the acid that is generated. Completely fluorinated alkyl groups in which 100% of the hydrogen atom have been substituted with fluorine atoms are the most desirable.

In the above general formula (B-3), examples of the alkyl group containing no substituent groups or haloalkyl group represented by $R^{34}$ include the same alkyl groups containing no substituent groups and haloalkyl groups described above for the group $R^{31}$.

Examples of the bivalent or trivalent aromatic hydrocarbon group represented by $R^{35}$ include groups in which a further one or two hydrogen atoms respectively are removed from an aryl group of the aforementioned group $R^{32}$.

Examples of the alkyl group containing no substituent groups or haloalkyl group represented by $R^{36}$ include the same alkyl groups containing no substituent groups and haloalkyl groups described above for the group $R^{33}$.

p is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Furthermore, further examples include the compounds represented by the chemical formulas shown below.

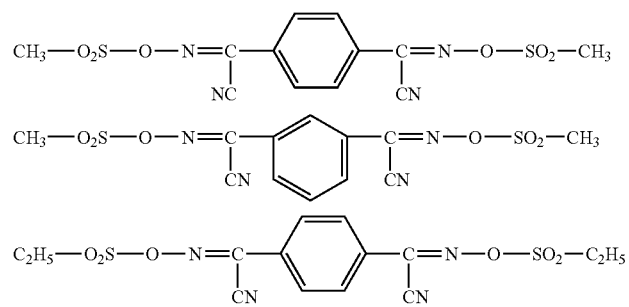

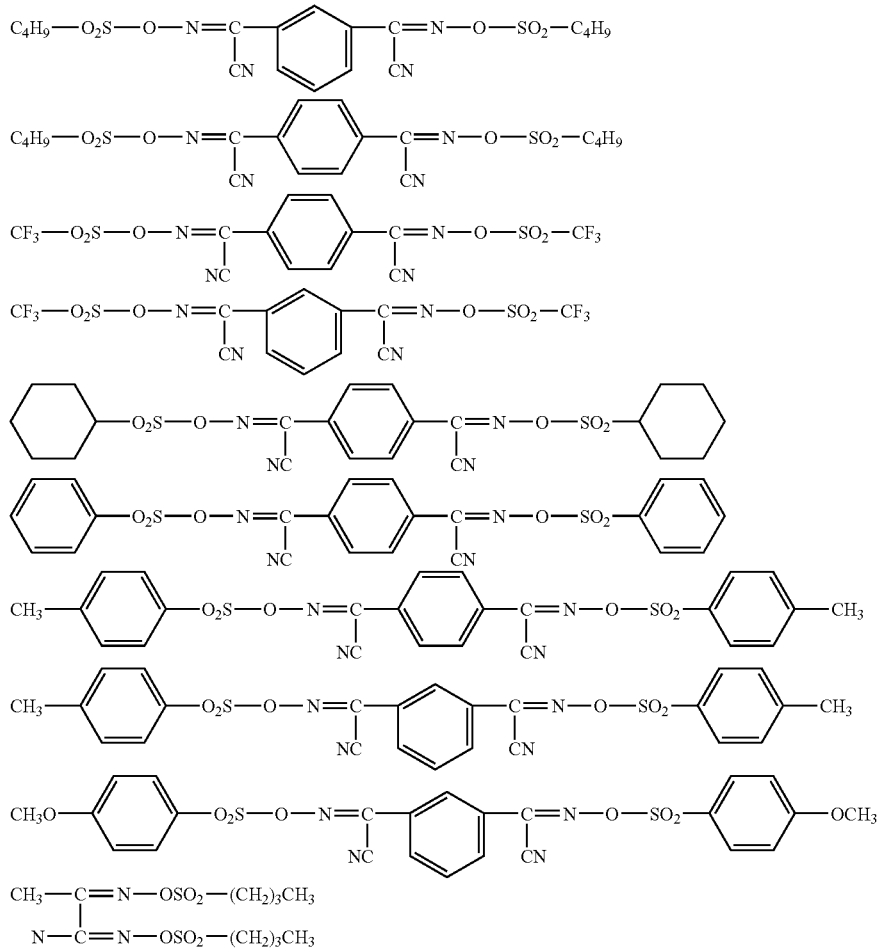
Furthermore, of the compounds represented by the aforementioned general formulas (B-2) and (B-3), examples of particularly preferred compounds include those shown below.
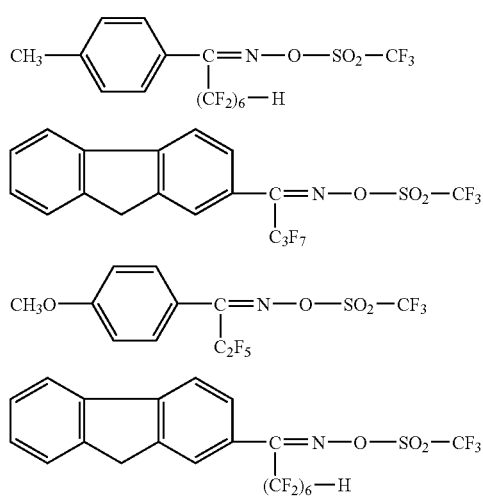
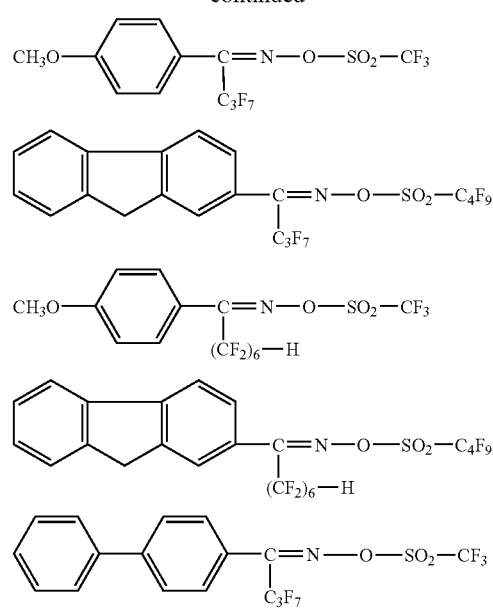

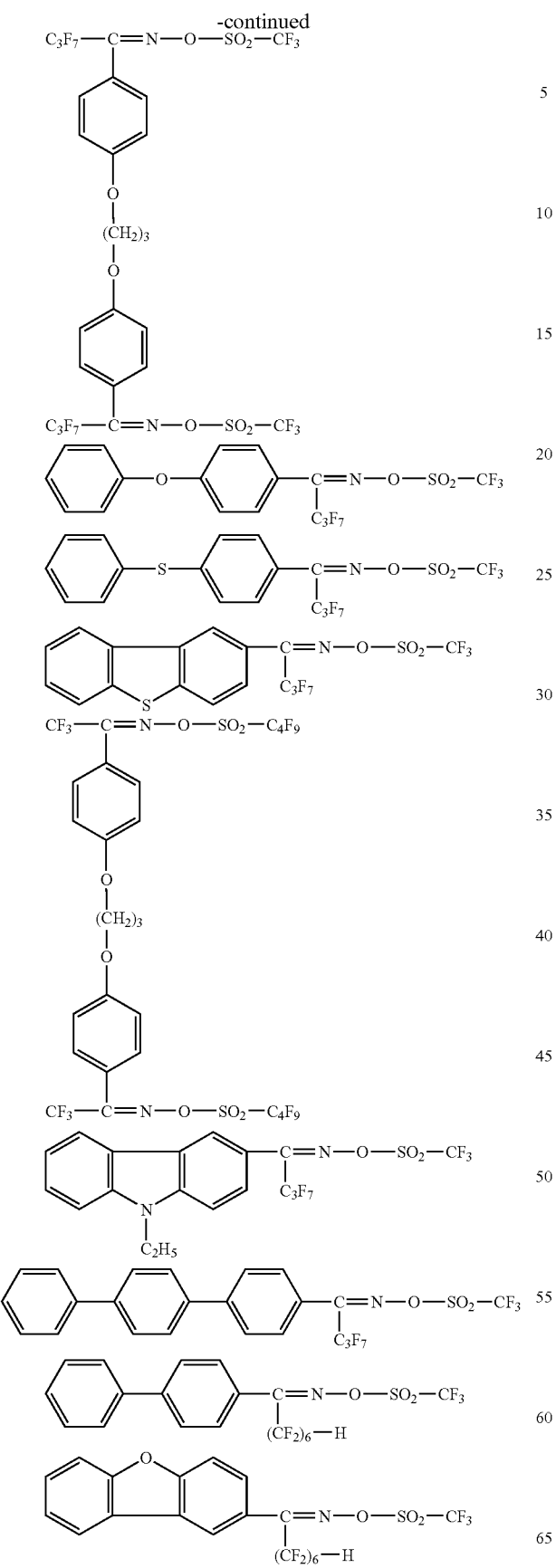
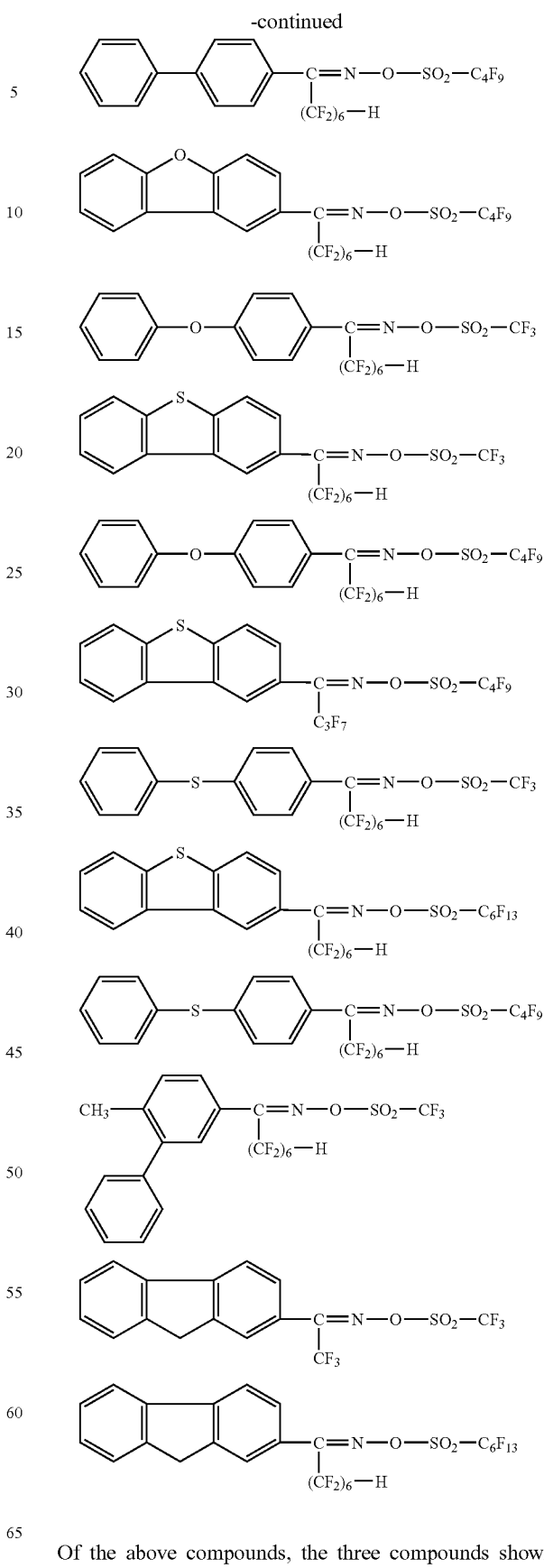
Of the above compounds, the three compounds shown below are particularly desirable.

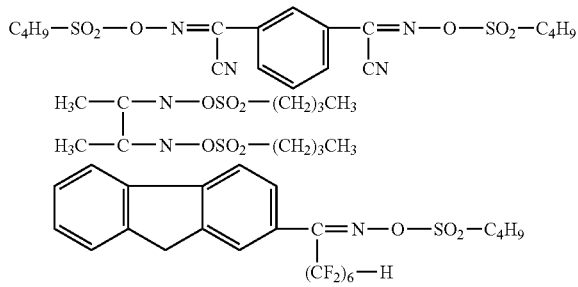

Of the various diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (wherein A=3), 1,4-bis(phenylsulfonyldiazomethylsulfonyl)butane (wherein A=4), 1,6-bis(phenylsulfonyldiazomethylsulfonyl)hexane (wherein A=6), 1,10-bis(phenylsulfonyldiazomethylsulfonyl)decane (wherein A=10), 1,2-bis(cyclohexylsulfonyldiazomethylsulfonyl)ethane (wherein B=2), 1,3-bis(cyclohexylsulfonyldiazomethylsulfonyl)propane (wherein B=3), 1,6-bis(cyclohexylsulfonyldiazomethylsulfonyl)hexane (wherein B=6), and 1,10-bis(cyclohexylsulfonyldiazomethylsulfonyl)decane (wherein B=10).

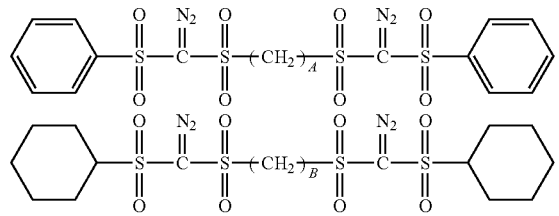

The acid generator (B3) may use either a single compound, or a combination of two or more different compounds.

The quantity of the component (B) within the positive resist composition of the present invention is typically within a range from 0.5 to 30 parts by weight, and is preferably from 1 to 10 parts by weight, per 100 parts by weight of the component (A). Ensuring the quantity satisfies this range enables satisfactory pattern formation to be achieved, enables a uniform solution to be obtained, and ensures that the storage stability is favorable.

<Other Optional Components>

In the positive resist composition of the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these nitrogen-containing organic compounds have already been proposed, and any of these known compounds can be used, although an aliphatic amine, and particularly a secondary aliphatic amine or tertiary lower aliphatic amine is preferred.

Examples of these aliphatic amines include amines in which at least one hydrogen atom of ammonia ($NH_3$) has been substituted with an alkyl group or hydroxyalkyl group of no more than 12 carbon atoms (that is, alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Of these, alkyl alcohol amines and trialkyl amines are preferred, and alkyl alcohol amines are the most desirable. Amongst the various alkyl alcohol amines, triethanolamine and triisopropanolamine are the most preferred.

These compounds may be used either alone, or in combinations of two or more different compounds.

The component (D) is typically used in a quantity within a range from 0.01 to 5.0 parts by weight per 100 parts by weight of the component (A).

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) may also be added to the positive resist composition of the present invention as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other miscible additives can also be added to the positive resist composition of the present invention according to need, and examples include additive resins for improving the performance of the resist film, surfactants for improving the coating properties, dissolution inhibitors, plasticizers, stabilizers, colorants, halation prevention agents, and dyes and the like.

The positive resist composition of the present invention can be produced by dissolving the materials in an organic solvent.

The organic solvent may be any solvent capable of dissolving the various components used to generate a uniform solution, and one or more solvents selected from known materials used as the solvents for conventional chemically amplified resists can be used.

Examples of the solvent include lactones such as γ-butyrolactone, ketones such as acetone, methyl ethyl ketone, cyclohexanone, methyl isoamyl ketone and 2-heptanone, polyhydric alcohols and derivatives thereof such as ethylene glycol, ethylene glycol monoacetate, diethylene glycol, diethylene glycol monoacetate, propylene glycol, propylene glycol monoacetate, dipropylene glycol, the monomethyl ether, monoethyl ether, monopropyl ether, monobutyl ether or monophenyl ether of dipropylene glycol monoacetate, cyclic ethers such as dioxane, and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent containing two or more different solvents.

Furthermore, mixed solvents produced by mixing propylene glycol monomethyl ether acetate (PGMEA) with a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and is even more preferably from 2:8 to 8:2.

More specifically, in those cases where EL is added as the polar solvent, the weight ratio PGMEA:EL is preferably within a range from 1:9 to 9:1, and is even more preferably from 2:8 to 8:2.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should be set in accordance with the coating film thickness required, at a concentration that enables favorable application of the solution to a substrate or the like, and typically the quantity of solvent is set so that the solid fraction concentration of the resist composition falls within a range from 2 to 20% by weight, and preferably from 5 to 15% by weight.

<<Method of Forming Resist Pattern>>

A method of forming a resist pattern according to the present invention can be conducted, for example, using the method described below.

Namely, the positive resist composition described above is first applied to a substrate such as a silicon wafer using a spinner or the like, and a prebake is then conducted under temperature conditions of 80 to 150° C., for a period of 40 to 120 seconds, and preferably for 60 to 90 seconds, thereby forming a resist film.

Subsequently, following selective exposure of the resist film, for example with an ArF excimer laser through a desired mask pattern using an ArF exposure apparatus, PEB (post exposure baking) is conducted under temperature conditions of 80 to 150° C. for 40 to 120 seconds, and preferably for 60 to 90 seconds.

Subsequently, developing is conducted using an alkali developing liquid such as an aqueous solution of tetramethylammonium hydroxide with a concentration of 0.1 to 10% by weight. If required, a post bake may be conducted following the developing treatment.

In this manner, a resist pattern that is faithful to the mask pattern can be obtained.

An organic or inorganic anti-reflective film may also be provided between the substrate and the applied layer of the resist composition.

There are no particular restrictions on the wavelength used for the exposure (the irradiation), and an ArF excimer laser, KrF excimer laser, $F_2$ excimer laser, or other radiation such as EUV (extreme ultra violet), VUV (vacuum ultra violet), EB (electron beam), X-ray or soft X-ray radiation can be used. The resist composition according to the present invention is particularly effective for use with an ArF excimer laser.

As described above, a positive resist composition and a method of forming a resist pattern according to the present invention are capable of forming a resist pattern with a reduced level of LER and excellent pattern shape.

The reasons for these observations are not entirely clear, but it is believed that the structure of the acid-dissociable, dissolution-inhibiting group (the group represented by the formula $—C(R^1)(R^2)—O(CH_2)_n—Y$) within the structural unit (a1) of the component (A), and the structure of the anion portion of the onium salt (B1) have a considerable effect. In other words, it is thought that because the onium salt (B1) has a specific anion portion that contains a cyclic group, it contributes significantly to reduced LER and improved pattern shape, but because the acid generated by this onium salt is too weak to cause dissociation of the types of tertiary ester-based acid-dissociable, dissolution-inhibiting groups used in conventional resists, it is unable to form a resist pattern with conventional resists. However, in a combination with the type of acid-dissociable, dissolution-inhibiting group described above, this onium salt is able to cause sufficient dissociation of the acid-dissociable, dissolution-inhibiting groups to ensure a satisfactory increase in the alkali solubility of the entire resist, thereby enabling a resist pattern to be formed. Furthermore, in addition to the effects achieved by combining the structural unit (a1) and the onium salt (B1), it is thought that the additional effects achieved by also including the structural units (a2) and (a3) enable a superior LER reduction effect and a superior pattern shape improvement effect to be achieved.

The reasons that the onium salt (B1) contributes to a reduction in the LER and an improvement in the shape are not entirely clear, but it is thought that because the anion portion has a specific structure, the diffusion behavior (such as the diffusion length) of acid within the resist film composed of the type of component (A) described above will differ from the behavior observed in the case of other onium salts such as the onium salt (B2) or the like.

EXAMPLES

As follows is a description of examples of the present invention, although the scope of the present invention is in no way limited by these examples.

Synthesis Example 1

Synthesis of (2-adamantyloxymethyl)methacrylate 6.9 g of methacrylic acid was dissolved in 200 ml of tetrahydrofuran, and 8.0 g of triethylamine was added. Following stirring at room temperature, a solution containing 15 g of 2-adamantyl chloromethyl ether dissolved in 100 ml of tetrahydrofuran was added dropwise to the reaction solution. Following stirring for 12 hours at room temperature, the precipitated salt was removed by filtration. The solvent was removed from the remaining filtrate by evaporation, the residue was dissolved in 200 ml of ethyl acetate, and following washing with pure water (100 ml×3), the solvent was removed by evaporation. The residue was then allowed to stand under ice cooling, thereby yielding a white solid.

Results of measuring the infrared absorption spectrum (IR) and the proton nuclear magnetic resonance spectrum ($^1$H-NMR) are shown below.

IR (cm$^{-1}$): 2907, 2854 (C—H stretch), 1725 (C=O stretch), 1638 (C=C stretch)

$^1$H-NMR (CDCl$_3$, internal standard: tetramethylsilane) ppm: 1.45 to 2.1 (m, 17H), 3.75 (s, 1H), 5.45 (s, 2H), 5.6 (s, 1H), 6.12 (s, 1H)

The obtained compound ((2-adamantyloxymethyl)methacrylate) is represented by a chemical formula shown below.

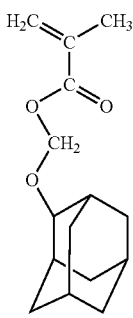

Synthesis Example 2

Synthesis of Resin 1

20.0 g of the (2-adamantyloxymethyl)methacrylate obtained in the above synthesis example 1, 13.6 g of γ-butyrolactone methacrylate, and 8.8 g of tricyclodecanyl methacrylate were dissolved in 200 ml of tetrahydrofuran, and 1.64 g of azobisisobutyronitrile was added. Following refluxing for 12 hours, the reaction solution was added dropwise to 2 L of n-heptane. The precipitated resin was collected by filtration and dried under reduced pressure, yielding a white resin powder (resin 1).

The structure of the resin 1 is shown below.

The results of a GPC measurement of the resin 1 revealed a weight average molecular weight (Mw) of 7,000 and a polydispersity (Mw/Mn) of 2.6. Furthermore, analysis by carbon-13 nuclear magnetic resonance spectroscopy ($^{13}$C-NMR) revealed a compositional ratio between the different structural units shown in the structural formula below of p/q/r=40/40/20 (molar ratio).

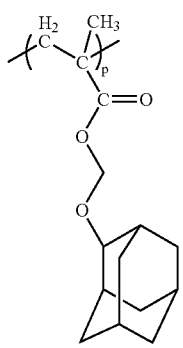 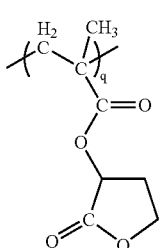

-continued

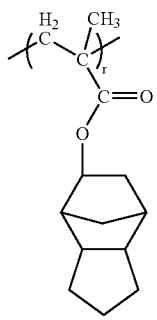

Synthesis Example 3

Synthesis of Resin 2

20.0 g of the (2-adamantyloxymethyl)methacrylate obtained in the above synthesis example 1, 18.9 g of norbornane lactone methacrylate, and 8.8 g of tricyclodecanyl methacrylate were dissolved in 200 ml of tetrahydrofuran, and 1.64 g of azobisisobutyronitrile was added. Following refluxing for 12 hours, the reaction solution was added dropwise to 2 L of n-heptane. The precipitated resin was collected by filtration and dried under reduced pressure, yielding a white resin powder (resin 2). The structure of the resin 2 is shown below.

The results of a GPC measurement of the resin 2 revealed a weight average molecular weight (Mw) of 7,700 and a polydispersity (Mw/Mn) of 1.8. Furthermore, analysis by carbon-13 nuclear magnetic resonance spectroscopy ($^{13}$C-NMR) revealed a compositional ratio between the different structural units shown in the structural formula below of p/q/r 40/40/20 (molar ratio).

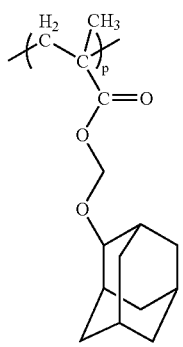 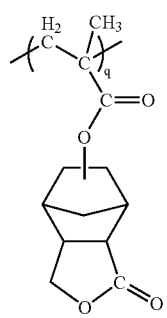

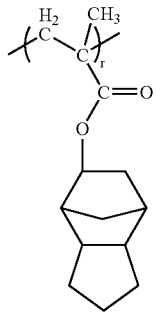

Examples 1 to 2

Comparative Examples 1 to 2

The components shown in Table 1 were mixed together and dissolved, yielding a series of positive resist composition solutions.

TABLE 1

| | Component (A) | Component (B) | | | Component (D) | Organic solvent | Other |
|---|---|---|---|---|---|---|---|
| | | (B1) | (B2) | | | | |
| Example 1 | Resin 1 (100) | PAG 1 (2.0) | PAG 2 (6.0) | PAG 3 (1.6) | Amine 1 (0.38) | Solvent 1 (750) | ADD 1 (25) |
| Example 2 | Resin 2 (100) | PAG 1 (2.0) | PAG 2 (6.0) | PAG 3 (1.6) | Amine 1 (0.38) | Solvent 1 (750) | ADD 1 (25) |
| Comparative example 1 | Resin 1 (100) | | PAG 2 (6.0) | PAG 3 (1.6) | Amine 1 (0.38) | Solvent 1 (750) | ADD 1 (25) |
| Comparative example 2 | Resin 2 (100) | | PAG 2 (6.0) | PAG 3 (1.6) | Amine 1 (0.38) | Solvent 1 (750) | ADD 1 (25) |

In Table 1, the numerical values shown within the parentheses (represent blend quantities (parts by weight).

PAG 1 to 3: The compounds represented by the chemical formulas shown below.

Amine 1: triethanolamine

Solvent 1: A mixed solvent in which PGMEA/EL=8/2 (weight ratio)

ADD 1: γ-butyrolactone

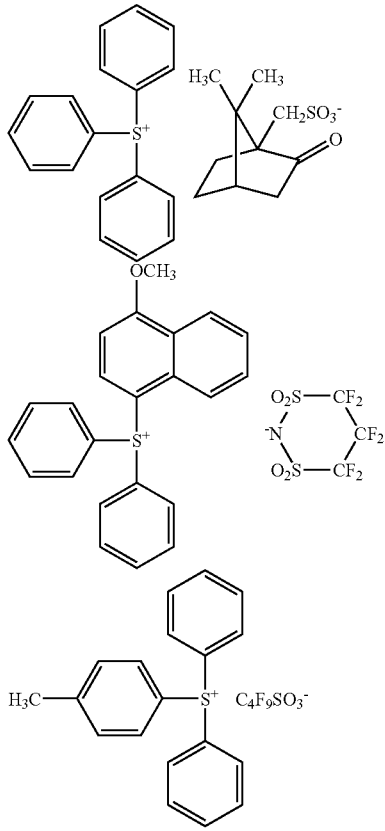

PAG 1

PAG 2

PAG 3

Subsequently, using the prepared positive resist composition solutions, the evaluations described below were conducted.

An organic anti-reflective film composition "ARC-29A" (a product name, manufactured by Brewer Science Ltd.) was applied to the surface of an 8-inch silicon wafer using a spinner, and the composition was then baked and dried on a hotplate at 215° C. for 90 seconds, thereby forming an organic anti-reflective film with a film thickness of 38 nm. The positive resist composition solution was then applied to the surface of this anti-reflective film using a spinner, and was then prebaked (PAB) and dried on a hotplate for 90 seconds at the PAB temperature shown in Table 2, thereby forming a resist film with a film thickness shown in Table 2.

Subsequently, this film was selectively irradiated with an ArF excimer laser (193 nm) through a mask pattern (a halftone mask), using an ArF exposure apparatus NSR-S302 (manufactured by Nikon Corporation; NA (numerical aperture)=0.60, ⅔ annular illumination).

The resist was then subjected to PEB (post-exposure baking) treatment for 90 seconds at the PEB temperature shown in Table 2, was subsequently subjected to puddle development for 60 seconds at 23° C. in a 2.38% by weight aqueous solution of tetramethylammonium hydroxide (TMAH), and was then washed for 20 seconds with water and dried, thus forming a line and space pattern (hereafter referred to as a L/S pattern) with a line width of 120 nm.

TABLE 2

| | Resist film thickness | PAB temperature | PEB temperature |
|---|---|---|---|
| Example 1 | 180 nm | 105° C. | 105° C. |
| Comparative example 1 | | | |
| Example 2 | 130 nm | 110° C. | 115° C. |
| Comparative example 2 | | | |

<LER>

The exposure dose (sensitivity) at which a 120 nm L/S pattern was formed with a ratio of line width: space width=1:1 was set as Eop, and for the 120 nm L/S pattern (1:1) obtained at this Eop value, the 3 σ value was determined, which is a measure of the LER. The 3σ value is determined by measuring the resist pattern width of the sample at 32 positions using a measuring SEM (product name: S-9220, manufactured by Hitachi, Ltd.), and calculating the value of 3 times the standard deviation a (namely, 3σ) from these measurement results. The smaller this 3σ value is, the lower the level of roughness, indicating a resist pattern with a uniform width. The measurement voltage was 800 V.

<Shape>

The cross-sectional shape of the 120 nm L/S pattern (1:1) formed at the above Eop value was evaluated using a measuring SEM, based on the following criteria.

A: very rectangular

B: rectangular

D: the pattern TOP exhibits rounding

The results are shown in Table 3.

TABLE 3

|  | LER | Shape |
|---|---|---|
| Example 1 | 4.5 nm | B |
| Comparative example 1 | 6.2 nm | D |
| Example 2 | 6.2 nm | A |
| Comparative example 2 | 8.7 nm | D |

As is evident from the above results, the examples 1 and 2 exhibited dramatic improvements in the level of LER compared with the comparative examples 1 and 2 respectively, in which the resist patterns were formed under the same conditions, but with the exception of not adding the PAG 1. Furthermore, the pattern shape was also rectangular in the examples 1 and 2.

In contrast, the comparative examples 1 and 2 exhibited greater LER, and exhibited poor shape. The DOF (depth of focus) was also superior for the examples 1 and 2.

INDUSTRIAL APPLICABILITY

A resist pattern with a reduced level of LER and excellent shape can be formed.

The invention claimed is:

1. A positive resist composition, comprising: a resin component (A) that exhibits increased alkali solubility under action of acid; and an acid generator component (B) that generates acid on exposure to radiation, wherein said resin component (A) comprises one or more structural units (a1) selected from the group consisting of structural units represented by general formulas (a1-2) and (a1-4) shown below:

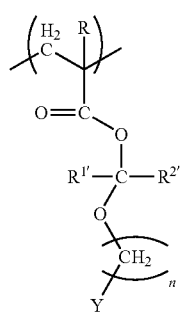

(a1-2)

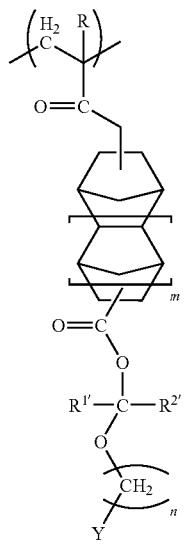

(a1-4)

[wherein, Y represents a lower alkyl group of 1 to 5 carbon atoms or an aliphatic cyclic group; n represents either 0 or an integer from 1 to 3; m represents either 0 or 1; R represents a hydrogen atom, fluorine atom, lower alkyl group of 1 to 5 carbon atoms, or fluorinated lower alkyl group of 1 to 5 carbon atoms; and $R^{1'}$ and $R^{2'}$ each represent, independently, a hydrogen atom or a lower alkyl group of 1 to 5 carbon atoms], a structural unit (a2) derived from an acrylate ester that contains a lactone-containing monocyclic or polycyclic group, and a structural unit (a3), which is different from said structural unit (a1) and said structural unit (a2), and is derived from an acrylate ester that contains an aliphatic cyclic group-containing, non-acid-dissociable, dissolution-inhibiting group and contains no polar groups; and said acid generator component (B) comprises an onium salt (B1) having an anion portion represented by a general formula (B-01) shown below:

$$R^{41}—SO_3^-$$ (B-01)

[wherein, $R^{41}$ represents an alkyl group or fluoroalkyl group that contains a cyclic group of 4 to 12 carbon atoms].

2. A positive resist composition according to claim 1, wherein said anion portion represented by said general formula (B-01) is a camphorsulfonate ion.

3. A positive resist composition according to claim 2, wherein said camphorsulfonate ion is an ion represented by a chemical formula shown below

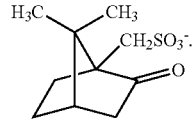

4. A positive resist composition according to claim 1, wherein said acid generator component (B) further comprises an onium salt (B2-1) represented by a general formula (b-1) or (b-2) shown below:

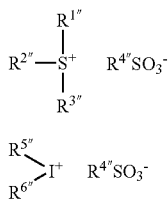
(b-1)

(b-2)

[wherein, $R^{1''}$ to $R^{3''}$, and $R^{5''}$ to $R^{6''}$ each represent, independently, an aryl group or an alkyl group; and $R^{4''}$ represents a straight-chain or branched alkyl group or fluoroalkyl group; provided that at least one of $R^{1''}$ to $R^{3''}$ represents an aryl group, and at least one of $R^{5''}$ to $R^{6''}$ represents an aryl group].

5. A positive resist composition according to claim 1, wherein said acid generator component (B) further comprises an onium salt (B2-2) having an anion portion represented by a general formula (b-3) or (b-4) shown below:

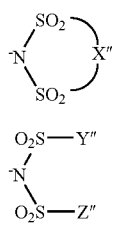
(b-3)

(b-4)

[wherein, X" represents an alkylene group of 2 to 6 carbon atoms in which at least one hydrogen atom has been substituted with a fluorine atom; and Y" and Z" each represent, independently, an alkyl group of 1 to 10 carbon atoms in which at least one hydrogen atom has been substituted with a fluorine atom].

6. A positive resist composition according to claim 4, wherein said acid generator component (B) further comprises an onium salt (B2-2) having an anion portion represented by a general formula (b-3) or (b-4) shown below:

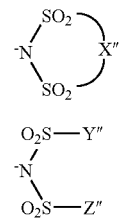
(b-3)

(b-4)

[wherein, X" represents an alkylene group of 2 to 6 carbon atoms in which at least one hydrogen atom has been substituted with a fluorine atom; and Y" and Z" each represent, independently, an alkyl group of 1 to 10 carbon atoms in which at least one hydrogen atom has been substituted with a fluorine atom].

7. A positive resist composition according to claim 1, further comprising: a nitrogen-containing organic compound (D).

8. A method of forming a resist pattern, comprising the steps of:
   forming a resist film on a substrate using a positive resist composition according to any one of claim 1 through claim 7;
   conducting exposure of said resist film; and
   developing said resist film to form a resist pattern.

\* \* \* \* \*

UNITED STATES PATENT AND TRADEMARK OFFICE
CERTIFICATE OF CORRECTION

PATENT NO. : 7,803,512 B2
APPLICATION NO. : 11/816272
DATED : September 28, 2010
INVENTOR(S) : Kinoshita et al.

It is certified that error appears in the above-identified patent and that said Letters Patent is hereby corrected as shown below:

Column 27, Line 33 After "above" insert --.--.

Column 33, Line 36 Change "H$_2$C" to --H$_3$C--.

Column 44, Line 5 After "R$^3$" insert --,--.

Column 44, Line 53 Change "R$^{1"}$" to --R$^{5"}$--.

Column 44, Line 57 Change "R" to --R$^{5"}$--.

Column 51, Line 39 Before "–C" change "N" to --CH$_3$--.

Column 60, Line 39 After "p/q/r" insert --=--.

Column 61, Line 24 Before "represent" change "(" to --( )--.

Column 62, Line 59 Change "3 σ" to --3σ--.

Column 62, Line 64 Change "a" to --σ--.

Signed and Sealed this
Twelfth Day of July, 2011

David J. Kappos
*Director of the United States Patent and Trademark Office*